(12) United States Patent
Daykin-Iliopoulos et al.

(10) Patent No.: US 11,690,161 B2
(45) Date of Patent: Jun. 27, 2023

(54) HOLLOW CATHODE APPARATUS

(71) Applicant: University of Southampton, Southampton (GB)

(72) Inventors: Alexander Joey Nikolaos Daykin-Iliopoulos, Southampton (GB); Stephen Bernard Gabriel, Southampton (GB); Igor Golosnoy, Southampton (GB)

(73) Assignee: University of Southampton, Southampton (GB)

(*) Notice: Subject to any disclaimer, the term of this patent is extended or adjusted under 35 U.S.C. 154(b) by 233 days.

(21) Appl. No.: 17/054,248

(22) PCT Filed: May 10, 2019

(86) PCT No.: PCT/EP2019/062069
§ 371 (c)(1),
(2) Date: Nov. 10, 2020

(87) PCT Pub. No.: WO2019/215335
PCT Pub. Date: Nov. 14, 2019

(65) Prior Publication Data
US 2021/0100089 A1    Apr. 1, 2021

(30) Foreign Application Priority Data

May 11, 2018 (GB) ..................... 1807683

(51) Int. Cl.
*H05H 1/46* (2006.01)
*H01J 1/30* (2006.01)
(Continued)

(52) U.S. Cl.
CPC ............. *H05H 1/46* (2013.01); *H01J 1/30* (2013.01); *H01J 37/32* (2013.01); *H05H 1/54* (2013.01); *H05H 1/245* (2021.05)

(58) Field of Classification Search
None
See application file for complete search history.

(56) References Cited

U.S. PATENT DOCUMENTS 4,219,705 A * 8/1980 Hill .......................... H05H 1/46
                                                                    381/165
4,475,063 A * 10/1984 Aston ...................... H01J 27/08
                                                                    315/111.81
(Continued)

FOREIGN PATENT DOCUMENTS

CN    101599400 A    12/2009
CN    105788998 A    7/2016
(Continued)

OTHER PUBLICATIONS

"Sitael Hollow Cathodes for Low-Power Hall Effect Thrusters" by Daniela Pedrini, et al., IEEE Transactions on Plasma Science, vol. 46, No. 2, Feb. 1, 2018.
(Continued)

*Primary Examiner* — Srinivas Sathiraju
(74) *Attorney, Agent, or Firm* — Polsinelli, P.C.

(57) ABSTRACT

A hollow cathode apparatus includes an outer tubular dielectric barrier circumferentially surrounding an outer tubular surface of the cathode tube, the outer tubular dielectric barrier being composed of a barrier material which is electrically non-conductive. Also disclosed is a system comprising the hollow cathode apparatus, an anode which is spaced from the output end of the tubular cathode, and electrical circuitry connected between the cathode tube and the anode for connection to a source of electrical power for providing an electrical potential between the cathode and anode to cause an electric current to pass from the emitter into the input gas to form a plasma which is then output through the output end of the cathode tube to form a plasma plume. The electrical circuitry comprises: a first power (Continued)

supply for connecting the cathode and the cathode electrode to a first source of DC power in an ignition power mode, wherein the first power supply comprises a current control device which is adapted to control the current between the cathode and the cathode electrode, wherein the current control device is arranged to function as an anti-surge current stabiliser; and a second power supply for connecting the anode and the cathode to a second source of DC power in a steady state power mode.

16 Claims, 11 Drawing Sheets

(51) Int. Cl.
*H01J 37/32* (2006.01)
*H05H 1/54* (2006.01)
*H05H 1/24* (2006.01)

(56) References Cited

U.S. PATENT DOCUMENTS

| | | | | |
|---|---|---|---|---|
| 5,587,093 | A * | 12/1996 | Aston | H05H 1/48 219/121.36 |
| 5,754,000 | A * | 5/1998 | Skilton | H01J 61/24 313/565 |
| 6,130,512 | A * | 10/2000 | Manos | H01J 65/046 315/344 |
| 6,157,145 | A * | 12/2000 | Vollkommer | H01J 1/312 315/339 |
| 6,870,321 | B2 * | 3/2005 | Schartner | H01J 3/025 118/723 VE |
| 7,460,225 | B2 * | 12/2008 | Karanassios | H05H 1/30 356/246 |
| 7,573,202 | B2 * | 8/2009 | Eden | H01J 17/066 313/631 |
| 7,649,186 | B2 * | 1/2010 | Kabuki | B82Y 10/00 250/493.1 |
| 7,985,188 | B2 * | 7/2011 | Felts | C23C 16/401 427/527 |
| 8,512,796 | B2 * | 8/2013 | Felts | B05C 13/025 73/40 |
| 9,572,526 | B2 * | 2/2017 | Felts | G01N 23/2273 |
| 9,761,424 | B1 * | 9/2017 | Gorokhovsky | H01J 37/32055 |
| 9,980,361 | B2 * | 5/2018 | McDonald | H05H 1/24 |
| 9,997,325 | B2 * | 6/2018 | Hosch | H01J 37/32935 |
| 10,002,738 | B1 * | 6/2018 | Farnell | B22F 5/00 |
| 2002/0000775 | A1 * | 1/2002 | Shimazu | H01J 61/09 313/618 |
| 2003/0138573 | A1 * | 7/2003 | Mikhael | C03C 17/32 118/718 |
| 2003/0209961 | A1 * | 11/2003 | Schartner | H01J 3/025 313/231.31 |
| 2004/0000853 | A1 * | 1/2004 | Kaufman | H01J 1/025 313/339 |
| 2006/0132017 | A1 * | 6/2006 | Kaufman | H01J 1/025 313/231.31 |
| 2007/0045573 | A1 * | 3/2007 | Kleinschmidt | H05G 2/005 250/504 R |
| 2007/0170866 | A1 * | 7/2007 | Eden | G21F 1/106 313/631 |
| 2007/0222358 | A1 * | 9/2007 | Shonka | H01J 1/025 313/339 |
| 2008/0116054 | A1 * | 5/2008 | Leach | B01D 53/72 204/157.3 |
| 2008/0136309 | A1 * | 6/2008 | Chu | H01J 37/08 313/361.1 |
| 2010/0117514 | A1 * | 5/2010 | Morioka | H01J 61/0672 313/356 |
| 2010/0298738 | A1 * | 11/2010 | Felts | B05D 5/08 118/712 |
| 2014/0308661 | A1 * | 10/2014 | Holmes | G01N 35/0092 435/6.1 |
| 2014/0315347 | A1 * | 10/2014 | Ruzic | H05H 1/46 315/111.21 |
| 2014/0354138 | A1 * | 12/2014 | Rand | H01J 1/025 313/633 |
| 2015/0211123 | A1 * | 7/2015 | Glukhoy | C23C 16/453 118/712 |
| 2016/0077015 | A1 * | 3/2016 | Holmes | G01N 33/50 506/9 |
| 2016/0217961 | A1 * | 7/2016 | Rand | H01J 27/08 |
| 2016/0320381 | A1 * | 11/2016 | Holmes | G01N 35/026 |
| 2017/0178869 | A1 * | 6/2017 | Chambers | H01J 37/08 |
| 2017/0178870 | A1 * | 6/2017 | Chambers | H01J 37/08 |
| 2017/0347443 | A1 * | 11/2017 | Denning | H01J 41/12 |
| 2017/0367168 | A1 * | 12/2017 | McDonald | H01J 37/32596 |
| 2018/0159459 | A1 * | 6/2018 | Mills | H05H 1/48 |
| 2018/0240656 | A1 * | 8/2018 | Gorokhovsky | C23C 14/22 |
| 2018/0247797 | A1 * | 8/2018 | Gorokhovsky | C23C 14/0605 |
| 2018/0269024 | A1 * | 9/2018 | Nguyen | H05H 1/48 |
| 2018/0310393 | A1 * | 10/2018 | Castillo Acero | F03H 1/0056 |
| 2021/0204388 | A1 * | 7/2021 | McDonald | H05H 1/54 |

FOREIGN PATENT DOCUMENTS

| | | |
|---|---|---|
| CN | 105895473 A | 8/2016 |
| JP | S63174239 A | 7/1988 |
| JP | 2004169606 A | 6/2004 |
| JP | 2011074887 A | 4/2011 |
| RU | 2662795 C1 | 7/2018 |

OTHER PUBLICATIONS

"Inflience of Power Throughout Heaterless Hollow Cathode Ignition" by Alexander Daykin-Iliopoulos, May 5, 2016.
Thermal Profile of a Lanthanum Hexaboride Heaterless Hollow Cathode by Alexander Daykin-Iliopoulos, et al., Oct. 8, 2017.
Search Report under Section 17(6) in related GB Application No. 1807683.6 dated Jun. 26, 2019.
International Search Report and Written Opinion in related international application No. PCT/EP2019/062069 dated Sep. 23, 2019.
Partial Search Report in related international application No. PCT/EP201 9/062069 dated Jul. 22, 2019.
Search Report under Section 17(5) in related GB Application No. 1807683.6 dated Sep. 28, 2018.

* cited by examiner

HOLLOW CATHODE APPARATUS

FIELD OF THE INVENTION

The present invention relates to a hollow cathode apparatus. The hollow cathode apparatus is configured to function as an electron source. The hollow cathode apparatus may be used as a component of a propulsion system. The present invention particularly relates to a heaterless hollow cathode (HHC) apparatus which has application for use in propulsion systems and thrusters, such as space propulsion systems exemplified by, but not limited to, Hall Effect Thrusters and Gridded Ion Engines, and for use in laboratory testing and various terrestrial propulsion and thruster applications. However, due to the simplicity and cost-effectiveness of the HHC design, it is highly applicable for laboratory testing and various terrestrial applications.

BACKGROUND

As is known to those skilled in the art, the role of a hollow cathode apparatus is to function as an electrons source, which provides a source of electrons. Such a hollow cathode apparatus is known as an essential component of an electric propulsion system used on spacecraft. The electric propulsion (EP) system produces thrust by electrostatically/electromagnetically expelling ions from the spacecraft. It is known that, dependent on the propulsion system type, the hollow cathode apparatus, functioning as the electron source, provides either or both of the following effects: A) due to the EP system expelling ions away from the spacecraft there is a charge build up, so to counter this there is a hollow cathode apparatus to expel just as many electrons, thereby 'neutralising' the charge build up; and/or B) to generate the ions in the propulsion system, electrons are needed, which is the provided by the hollow cathode apparatus, to ionise the gas. The ions are then accelerated in a propulsion system and expelled to propel the spacecraft.

The development of high current hollow cathodes is of importance to meet the demand of increasingly powerful Gridded Ion Engines and Hall Effect Thrusters (D. Lev, "The Technological and Commercial Expansion of Electric Propulsion in the Past 24 Years," in 35th International Electric Propulsion Conference, Atlanta, USA, 2017). Cathodes supplying high currents are increasingly utilizing lanthanum hexaboride (LaB6) emitters, due to their high-density emission, lifetime and reasonable handling capabilities (D. Goebel and E. Chu, "High-Current Lanthanum Hexaboride Hollow Cathode for High-Power Hall Thrusters," Journal of Propulsion and Power, vol. 30, pp. 35-40, 2014). However, LaB6 cathodes theoretically operate at temperatures ~400 K higher than traditionally used Barium Oxide cathodes, which operate around 1500 K. This poses greater challenges for the cathodes ignition system due to the need of raising the emitter temperature to these higher emissive temperatures in order to start the cathode operation.

The ohmic heater component commonly used to raise the emitter temperature to enable thermionic emission, has inherent reliability issues from thermal fatigue caused by the thermal cycling with large temperature variations (T. Verhey, "Heater Validation for the Next-C Hollow Cathodes," in 35th International Electric Propulsion Conference, Atlanta, USA, 2017), which is further exacerbated with use of LaB6 emitters.

A heaterless hollow cathode (HHC) in which the emitter heating is driven by a discharge to the emitter allows for significantly higher reliability by completely removing the heater component. There are also multiple other benefits including, reduction in ignition time from minutes to seconds due to direct emitter heating through ion bombardment, and, substantially reduced system costs due to the removal of the heater and its power supply.

Conventionally designed cathodes have achieved heaterless ignition (D. Pedrini, R. Albertoni, F. Paganucc, and M. Andrenucc, "Development of a Lab6 Cathode for High-Power Hall Thrusters," in International Electric Propulsion Conference, Kobe, Japan, 2015), though this requires very high ignition voltages (>1 kV) and propellant flow rates (>50 sccm Xe). Therefore, alternative dedicated HHCs are being developed which have a reduced keeper orifice that increases pressure in the cathode-keeper gap. These devices have demonstrated ignition at nominal propellant flow rates (<20 sccm Xe) and have reasonable ignition voltages (<0.5 kV). However, they have the drawback of a reduced cathode-anode election extraction efficiency, due the reduced keeper aperture, thus resulting in a higher anodic voltage for a given current (D. Lev, D. Mykytchuk, and G. Alon, "Heaterless Hollow Cathode Characterization and 1,500 Hr Wear Test," in 52nd AIAA/SAE/ASEE Joint Propulsion Conference, Salt Lake City, USA, 2016), and increased keeper erosion. In addition, these systems do not directly heat the emitter via a uniform diffusive discharge during the ignition, thus causing highly non-uniform erosion of the emitter with high power losses.

A paper by Arkhipov (B. Arkhipov, "Development and Research of Heaterless Cathode-Neutralizer for Linear Hall Thrusters (Lhd) and Plasma Ion Thrusters (Pit)," in 25th International Electric Propulsion Conference, Cleveland, USA, October, 1997) discloses a low current class heaterless cathode which contains an additional emissive electrode that ignites to the main cathode emitter through a non-diffusive high current, low voltage discharge to heat both emitters in microseconds, causing very high thermal gradients and non-uniform erosion of the emitter. Once ignited both emitters thermionically emit, with the current being drawn to a keeper and anode electrodes.

The present invention aims to overcome these problems in the prior art.

The present invention also aims to provide an HHC which is simple in construction and operation and cost-effective to manufacture.

The present invention further aims to provide an HHC which is effective in a propulsion system, and is also highly applicable for laboratory testing and various terrestrial applications.

SUMMARY OF THE INVENTION

The present invention accordingly provides a hollow cathode apparatus, the apparatus comprising:

a cathode tube composed of an electrically conductive material, the cathode tube having an input end for receiving an input gas and an output end, opposite to the input end, for outputting a plasma formed from the input gas, the cathode tube defining a central hollow cavity for forming the plasma, a tubular emitter positioned internally within the cathode tube and circumferentially surrounding an end portion of the central hollow cavity which is adjacent to the output end, wherein an outer tubular surface of the tubular emitter is electrically connected to an inner tubular surface of the cathode tube, and the tubular emitter is composed of a material for emitting electrons into the input gas to form a plasma in the end portion of the central hollow cavity when an electrical potential, above a particular potential threshold, is applied to the material of the tubular emitter, and an outer tubular dielectric barrier circumferentially surrounding an outer tubular surface of the cathode tube, the outer tubular dielectric barrier being composed of a barrier material which is electrically non-conductive.

Optionally, the outer tubular dielectric barrier includes a flanged end region which surrounds an end surface of the cathode tube at the output end.

Optionally, the hollow cathode apparatus further comprises an inner tubular dielectric barrier circumferentially surrounding a surface portion of the inner tubular surface of the cathode tube, which surface portion is adjacent to the tubular emitter, and the inner tubular dielectric barrier is composed of a barrier material which is electrically non-conductive. Typically, the barrier material which is electrically non-conductive is composed of, or comprises, a dielectric material selected from a ceramic material or a glass material. The ceramic material or glass material may be selected from alumina, zirconia, silicon nitride, boron nitride, a glass ceramic, or macor, or any combination thereof.

Optionally, the tubular dielectric barrier has a thickness of from 0.1 to 5 mm, further optionally from 0.5 to 2 mm.

The hollow cathode apparatus preferably further comprises a tubular cathode electrode circumferentially surrounding the cathode tube, wherein the tubular cathode electrode has a tubular body circumferentially surrounding the outer tubular surface of the cathode tube and the outer tubular dielectric barrier, and a flange covering the output end of the cathode tube and defining an output orifice within the flange, the output orifice is aligned with, or concentric with, the end portion of the central hollow cavity.

Preferably, the tubular cathode electrode and the cathode tube are separated by an electrical insulation material provided therebetween at, or in the vicinity of, the input end of the cathode tube.

Optionally, the hollow cathode apparatus further comprises a tubular keeper electrode circumferentially surrounding the tubular cathode electrode, wherein the tubular keeper electrode has a tubular body circumferentially surrounding an outer tubular surface of the tubular cathode electrode, and a keeper flange covering the flange of the tubular cathode electrode, the keeper flange defining a keeper output orifice within the keeper flange, the keeper output orifice being aligned with, and having a larger diameter than, the output orifice of the tubular cathode electrode.

Optionally, the tubular keeper electrode and the tubular cathode electrode are separated by an electrical insulation material provided therebetween at, or in the vicinity of, the input end of the cathode tube.

Preferably, the hollow cathode apparatus further comprises an end cover covering an end surface of the emitter. The end cover may be composed of, or may comprise, an electrically conductive metal, or a dielectric material selected from a ceramic material or a glass material. The electrically conductive metal may be selected from tungsten, molybdenum, graphite, rhenium or the ceramic or glass material may be selected from alumina, zirconia, silicon nitride, boron nitride, a glass ceramic, or macor, or any combination thereof.

Optionally, dependent on emitter material, the hollow cathode apparatus further comprises a sleeve layer sandwiched between the cathode tube and the emitter, the sleeve layer being composed of an electrically conductive material and electrically connecting the emitter to the cathode tube. The sleeve layer may be composed of, or may comprise, graphite or rhenium.

Preferably, the hollow cathode apparatus further comprises a radiation shielding layer adjacent to the outer tubular dielectric barrier, the radiation shielding layer circumferentially surrounding the cathode tube. Preferably, the radiation shielding layer is sandwiched between the outer tubular dielectric barrier and the cathode tube. The radiation shielding layer may be composed of, or may comprise, a metal foil. The metal foil may be selected from molybdenum, tantalum, or rhenium.

Typically, the cathode tube is composed of a refractory metal or refractory metal alloy, such as molybdenum, tantalum, or rhenium, or any combination thereof.

Typically, the emitter is composed of, or comprises, lanthanum hexaboride, calcium aluminate electride, or a porous metal matrix, optionally a tungsten matrix, impregnated with at least one of, or a mixture of one or more of, ceramic inorganic oxides, optionally selected from barium oxide, calcium oxide, scandate and alumina.

Preferably, the hollow cathode apparatus further comprises an end wall at the output end of the cathode tube, the end wall closing the hollow cavity, and a supply conduit for inputting the input gas into the hollow cavity, the supply conduit having an outlet opening located in the end wall.

Optionally, the cathode tube further comprises an outwardly directed flange at the outer end of the cathode tube, the outwardly directed flange being fitted to the end wall.

Preferably, the hollow cathode apparatus is heaterless and is adapted so that the passage of electrical current through the emitter is sufficient to emit electrons from the emitter to form and sustain a plasma from the input gas.

The present invention further provides system comprising:

a hollow cathode apparatus according to the present invention, an anode which is spaced from the output end of the tubular cathode, and electrical circuitry connected between the hollow cathode apparatus and the anode for connection to a source of electrical power for providing an electrical potential between the cathode and anode to cause an electric current to pass from the emitter into the input gas to form a plasma which is then output through the output end of the cathode tube to form a plasma plume.

The present invention further provides a system comprising:

a hollow cathode apparatus, the apparatus comprising:

a. a cathode tube composed of an electrically conductive material, the cathode tube having an input end for receiving an input gas and an output end, opposite to the input end, for outputting a plasma formed from the input gas, the cathode tube defining a central hollow cavity for forming the plasma, b. a tubular emitter positioned internally within the cathode tube and circumferentially surrounding an end portion of the central hollow cavity which is adjacent to the output end, wherein an outer tubular surface of the tubular emitter is electrically connected to an inner tubular surface of the cathode tube, and the tubular emitter is composed of a material for emitting electrons into the input gas to form a plasma in the portion of the central hollow cavity when an electrical potential, above a particular potential threshold, is applied to the material of the tubular emitter, and c. a cathode electrode comprising a flange covering the output end of the cathode tube and defining an output orifice within the flange, the output orifice being aligned with the end portion of the central hollow cavity, an anode which is spaced from the output end of the tubular cathode, and electrical circuitry connected between the cathode tube and the anode for connection to a source of electrical power for providing an electrical potential between the cathode and anode to cause an electric current to pass from the emitter into the input gas to form a plasma which is then output through the output end of the cathode tube to form a plasma plume, wherein the electrical circuitry comprises:

a first power supply for connecting the cathode and the cathode electrode to a first source of DC power in an ignition power mode, wherein the first power supply comprises a current control device which is adapted to control the current between the cathode and the cathode electrode, wherein the current control device is arranged to function as an anti-surge current stabiliser during the ignition power mode; and a second power supply for connecting the anode and the cathode to a second source of DC power in a steady state power mode.

Optionally, the current control device is arranged to function, during the ignition power mode, as an anti-surge current stabiliser during initiation of a discharge and to stabilise the current during a subsequent secondary electron emission discharge. Optionally, the current control device is arranged to decrease in electrical resistance with increasing current between the cathode and the cathode electrode during the ignition power mode. Optionally, the current control device is arranged to control the current between the cathode and the cathode electrode during the ignition power mode to a predetermined maximum threshold, for example a maximum threshold current of 500 mA. Preferably, the current control device is arranged to control the current between the cathode and the cathode electrode during the ignition power mode to be within a range of from 10 to 500 mA. In some embodiments, the current control device comprises a thermistor, or an inductor, or a thermistor and an inductor in series.

Optionally, the first power supply comprises:

a first electrical conductor for electrically connecting a first terminal of the first source of DC power to the cathode, and a second electrical conductor, including the current control device, for electrically connecting a second terminal of the first source of DC power to the cathode electrode.

Typically, the second electrical conductor includes a first switch which can selectively open or close the electrical connection between the second terminal and the cathode electrode.

Typically, the first switch is a two way switch for selectively opening the electrical connection between the second terminal and the cathode electrode, and thereby short circuit the cathode and cathode electrode via a third electrical conductor connected between the first switch and the first electrical conductor.

Optionally, the system further comprises a fourth electrical conductor including a second switch for selectively electrically connecting the second terminal to the cathode electrode thereby to bypass the current control device.

Preferably, the cathode electrode comprises a tubular cathode electrode circumferentially surrounding the cathode tube, wherein the tubular cathode electrode has a tubular body circumferentially surrounding the outer tubular surface of the cathode tube and the outer tubular dielectric barrier, and the flange.

Optionally, the tubular cathode electrode and the cathode tube are separated by an electrical insulation material provided therebetween at, or in the vicinity of, the input end of the cathode tube.

Preferably, the cathode electrode further comprises a tubular keeper electrode circumferentially surrounding the tubular cathode electrode, wherein the tubular keeper electrode has a tubular body circumferentially surrounding an outer tubular surface of the tubular cathode electrode, and a keeper flange covering the flange of the tubular cathode electrode, the keeper flange defining a keeper output orifice within the keeper flange, the keeper output orifice being aligned with, and having a larger diameter than, the output orifice of the tubular cathode electrode.

Optionally, the tubular keeper electrode and the tubular cathode electrode are separated by an electrical insulation material provided therebetween at, or in the vicinity of, the input end of the cathode tube.

Optionally, the tubular keeper electrode is connected to a fifth electrical conductor electrically connecting the tubular keeper electrode to the second terminal via the current control device, The first source of DC power and the second source of DC power may be provided by separate DC power sources or by a common DC power source.

The present invention further provides a method of operating a system according to the present invention, the method comprising the steps of:

injecting input gas into the central hollow cavity;

in an ignition step, electrically connecting the cathode and the cathode electrode to the first source of DC power to apply an electrical potential between the emitter and the output orifice of the cathode electrode to cause a discharge in the input gas to heat the emitter, wherein the current control device functions as an anti-surge current stabiliser during the ignition step; and in a subsequent steady state power step, electrically connecting the anode and the cathode to the second source of DC power to apply an electrical potential between the emitter and the anode to cause a discharge in the input gas to form a plasma discharge which is outputted through the output end of the cathode tube to the anode.

Preferably, in step (b) the current control device decreases in electrical resistance with increasing current between the cathode and the cathode electrode during the ignition power mode.

Preferably, in step (b) the current control device is arranged to function, during the ignition power mode, as an anti-surge current stabiliser during initiation of a discharge and to stabilise the current during a subsequent secondary electron emission discharge Preferably, in step (b) the current between the cathode and the cathode electrode is controlled by the current control device to a predetermined maximum threshold. The current is typically controlled to a maximum threshold current of 500 mA, and is further preferably within a range of from 10 to 500 mA. Preferably, the current control device comprises a thermistor, an inductor, or a thermistor and an inductor in series.

Optionally, in step (b) the electrical potential is controlled to cause the discharge to be constituted by a Townsend discharge which transitions into a sustained secondary emission discharge which heats the emitter via ion bombardment prior to transitioning to a thermionic discharge in step (c).

Optionally, between steps (b) and (c), there is a further step (b') in which the emitter and the output orifice of the cathode electrode are electrically shorted to remove any electrical potential therebetween.

Optionally, in the ignition step (b), the cathode, the tubular cathode electrode and the keeper cathode electrode are electrically connected to the first source of DC power to apply an electrical potential between (i) the emitter and (ii) the output orifice of the cathode electrode and the keeper output orifice of the keeper cathode electrode.

Optionally, in step (b') the electrical potential is maintained between the emitter and the keeper output orifice of the keeper cathode electrode to cause a keeper discharge between the emitter and the keeper output orifice.

Optionally, after commencement of step (c), the electrical potential between the emitter and the keeper output orifice of the keeper cathode electrode is switched off to terminate the keeper discharge between the emitter and the keeper output orifice.

The preferred embodiments of the present invention can provide a high current (>20 A) heaterless hollow cathode apparatus that during the starting process effectively raises a low work function emitter's temperature, in a more efficient, less erosive and in a cost effective manner compared with the prior art.

Several key aspects of the preferred apparatus allow for these technical advantages that solve problems in the known apparatus as discussed above.

Firstly, one or more dielectric barriers are provided over the non-emitting cathode tube, so that the ignition discharge power is directly applied to the emitter only, reducing the power loss. Secondly, the electrical supplies have auxiliary current control measures to stabilise and maintain a uniform diffusive heating discharge, as well as stopping a large in-rush current during the ignition initiation that can be erosive. Thirdly, the cathode emitter is ignited to an additional electrode, which is essentially the cathode orifice, although electrically separated. This allows nominal ignition propellant flow rates and breakdown voltages without keeper orifice reduction and the subsequent penalty of higher operational anode voltages as discussed above. Fourthly, these aspects are incorporated into a modern in-space hollow cathode design, such that the system has substantive radiation shielding, and low thermal conductive losses, to enable high current class cathode operation. Finally, the hollow cathode system can be operated with only two standard power supplies, allowing cost effective integration of the device into any spacecraft unit as well as any laboratory testing setup which require a high current electron source. Furthermore, this is combined with the lower cost of the hollow cathode unit as it does not require an additional, relatively expensive heater component.

The preferred embodiments of the present invention can provide a high current hollow cathode apparatus which utilises an additional electrode to initiate the discharge, although the heaterless ignition is driven by a low current-high voltage discharge uniformly attaching to the cathode emitter. The uniform discharge heating results in reduced and more uniform erosion, allowing for longer operational lifetimes. In addition, the hollow cathode apparatus of the preferred embodiments of the present invention can ensure that the discharge can only attach to the emitter, thus efficiently heating the emitter, allowing slow diffusive heating of the emitter reducing system thermal shock through ignition, further extending operational lifetimes.

The preferred embodiments of the present invention have been tested experimentally and have demonstrated efficient heaterless ignition and operation up to high discharge currents of 30 A. These experimental results demonstrate the technical feasibility of the hollow cathode apparatus of the present invention and technical advantages and improvements that solve problems in the known apparatus as discussed above.

The physical hollow cathode system of the preferred embodiments of the present invention is designed in such a way to maximise the heating power efficiency by limiting the discharge attachment region during ignition to the emitter only, thus minimising the thermal losses, and minimising erosion due to the reduced ion bombardment required due to the increased efficiency. This is achieved in a cost effective approach due to the removal of the conventionally used Ohmic heater component, which is a significant portion of the manufacturing costs.

The general construction and operation of a hollow cathode apparatus, which may be suitable as a component for a propulsion system, are well known to those skilled in the art, as evidenced by the references identified above. The preferred embodiments of the present invention can provide technical advantages and improvements over the prior art by efficiently achieving a heaterless ignition of a high current hollow cathode, with nominal flow rates <20 sccm (standard cubic centimetres per minute) and reasonable ignition voltages of <400V. The hollow cathode apparatus of the preferred embodiments of the present invention can enhance how and where the ignition discharge power is applied during the ignition process, such that the ignition power is applied diffusively and directly to the emitter only, significantly increasing power efficiency and lowering erosion. This technical effect can be attained via suppressing discharge attachment other than to the emitter and controlling the current rise through ignition. This can provide the advantage of achieving highly efficient, low erosion, plasma heating of the emitter which is superior to that of the prior art.

The preferred embodiments of the present invention can provide a hollow cathode apparatus which can be used as a component of a propulsion system. The hollow cathode apparatus can provide that the function to neutralise the charge build up from the plasma plume emitted from the hollow cathode apparatus. The plasma plume can be employed to provide a propulsive plasma plume. When the hollow cathode apparatus is tested in combination with an anode, the resultant operation can simulate the operation of the hollow cathode apparatus in a propulsion system, and therefore can predict the performance of a propulsion system incorporating the hollow cathode apparatus.

The preferred embodiments of the present invention can provide a hollow cathode apparatus, and a system incorporating such a hollow cathode apparatus in combination with an anode, which can employ an improved ignition process which enables a heaterless hollow cathode apparatus to be employed. In the ignition process, gas is injected and an electric potential is applied between the emitter and cathode orifice, forming a breakdown discharge which is current controlled, via an electrical circuit, which then transitions to a secondary electron emission sustained discharge with the electrical circuit controls. After heating of the emitter, the discharge can be transferred to the anode, in a final operational mode. At this point the ignition power supply can be switched off and the main DC power source to be switched on.

The preferred embodiments of the present invention can provide a hollow cathode apparatus, which can be heaterless, in which an electrical circuit is provided to:
1) Prevent or stop a current surge that would otherwise occur during the first stage of ignition, thereby avoiding breakdown, that would be erosive on the emitter; the current surge can be prevented or stopped by an anti-surge current control device, for example comprising an inductance, a resistance or a combination of an inductance and a resistance; and 2) Allow stable operation in the glow discharge stage, the second stage of the ignition procedure which heats the emitter, allowing control of the heating to the emitter.

The electric circuit is provided to control the current during the ignition power mode. In the prior art, a ballast resistor has been used to controlled current, which is very power costly by only having a constant resistance (making it not suitable for space use). By providing a ballast resistor, the power loss from the resistor is huge, since as current goes up, the power increases according to the equation Power=Resistance×Current$^2$.

The preferred embodiments of the present invention can provide a hollow cathode apparatus which is significantly less power costly than known apparatus, since the thermistor has a high resistance at first then reduces resistance as the current increases, (as the current increases, such a high resistance is not needed). Accordingly, this resistance provided by the thermistor passively reduces or removes itself from the circuit as needed automatically. This aspect of the present invention and the associated technical advantages and effects are not known in the prior art. The inductor also does not waste energy; the inductor stabilises, and slows, the current change, though is less practical than the thermistor due to the size of the inductor needed, but can be used in combination with the thermistor. The preferred embodiments of the present invention also provide that the current control device can be actively removed from the circuit, by operation of a bypass switch, after the ignition mode so that the current control device is inactive during the steady state discharge mode.

Although the preferred embodiments of the present invention can provide a hollow cathode apparatus which can be used as a component of a propulsion system, in particular a space propulsion system, the present invention broadly relates to a hollow cathode apparatus which acts as an electron source, which has been developed for space propulsion, but alternatively may be arranged for use in other cathode (electron source) applications, including material processing, plasma antennae, gas purifying, plasma chemistry for surface modification, and/or electron beam welding.

BRIEF DESCRIPTION OF THE DRAWINGS

Embodiments of the present invention will now be described by way of example only with reference to the accompanying drawings, in which.

DETAILED DESCRIPTION

Figure 1A:
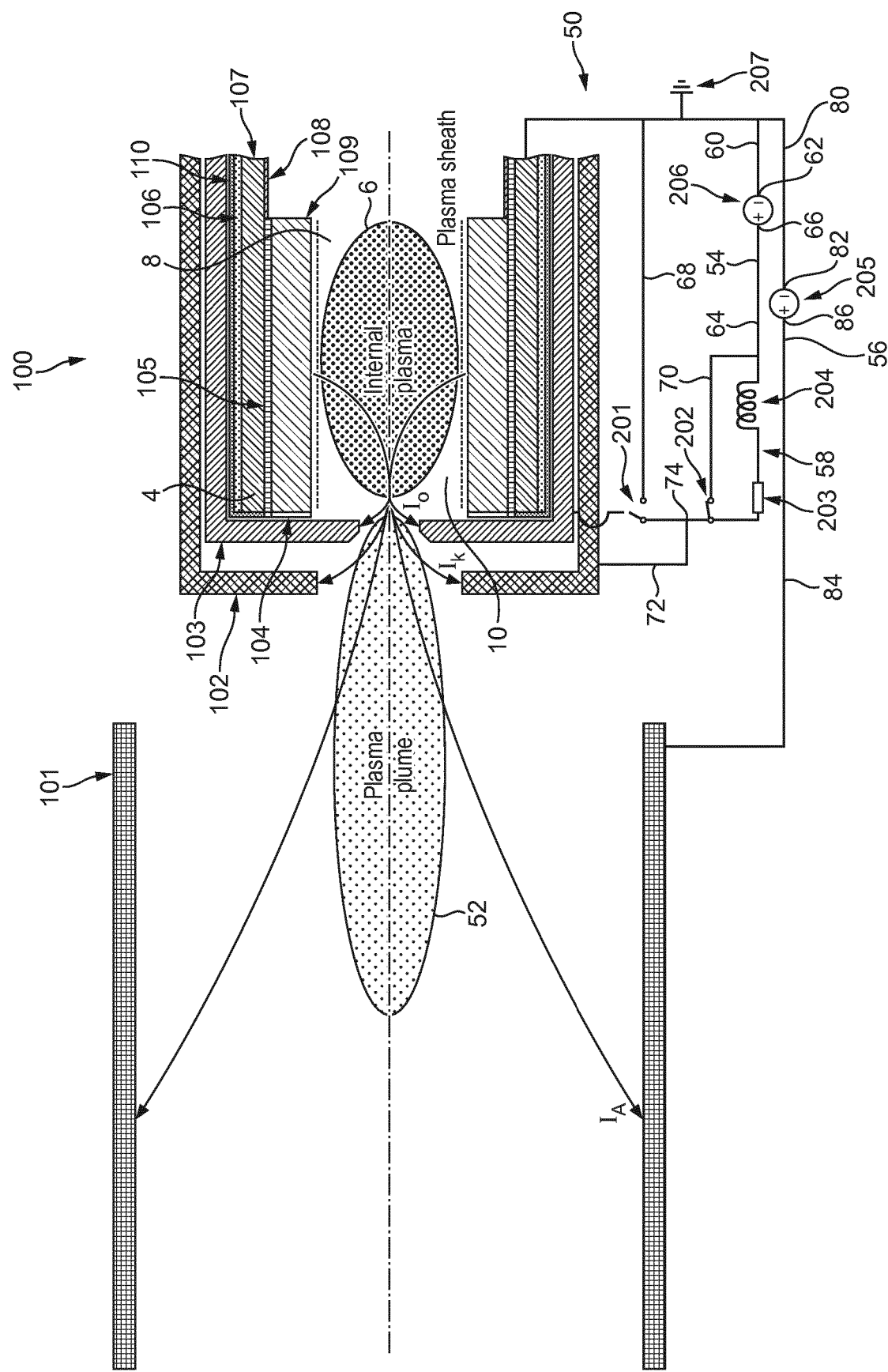
FIG. 1A is a schematic diagram of part of a heaterless hollow cathode (HHC) apparatus according to a preferred embodiment of the present invention, the diagram showing a side view and the apparatus functioning to form a plasma plume.
Figure 1B:
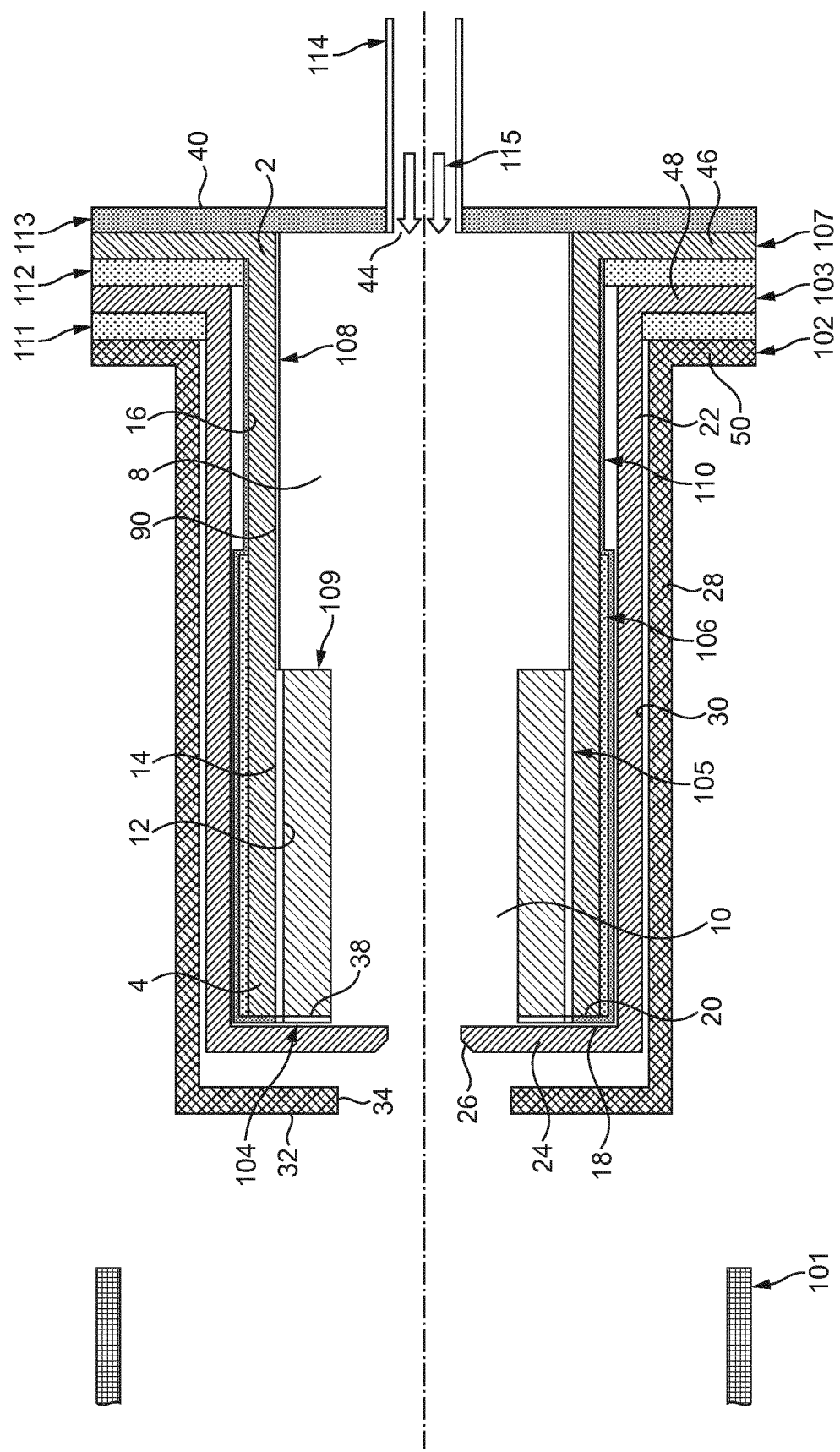
FIG. 1B is a schematic diagram of the HHC apparatus of FIG. 1A, the diagram showing a plan view from above and illustrating the mounting of the HHC apparatus.

Referring to FIGS. 1A and 1B, there is shown a heaterless hollow cathode (HHC) apparatus (100) in accordance with an embodiment of the present invention. In accordance with the preferred embodiments of the present invention, the hollow cathode apparatus is heaterless. In this specification, the term "heaterless" means that there is no ohmic heater for the emitter and the emitter heating is driven by a plasma discharge to the emitter.

The hollow cathode apparatus (100) comprises a cathode tube (107) composed of an electrically conductive material. The cathode tube (107) has an input end (2) for receiving an input gas (115) and an output end (4), opposite to the input end (2), for outputting a plasma (6) formed from the input gas (115). The input gas (115) typically used is xenon, although other noble gases are suitable for this operation, such as argon and krypton. The cathode tube (107) defines a central hollow cavity (8) for forming the plasma (6). Typically, the cathode tube (107) is composed of a refractory metal or refractory metal alloy, such as molybdenum, tantalum, or rhenium, or any combination thereof.

The hollow cathode apparatus (100) is configured so that the passage of electrical current through the emitter (109) is sufficient to emit electrons thermionically from the emitter (109) to form a plasma (6) from the input gas (115).

A tubular emitter (109) is positioned internally within the cathode tube (107) and circumferentially surrounds an end portion (10) of the central hollow cavity (8) which is adjacent to the output end (4). An outer tubular surface (12) of the tubular emitter (109) is electrically connected to an inner tubular surface (14) of the cathode tube (107). The tubular emitter (109) is composed of a material for emitting electrons into the input gas (115) to form a plasma (6) in the end portion (10) of the central hollow cavity (8) when an electrical potential, above a particular potential threshold, is applied to the material of the tubular emitter (109). The emitter (109) is a low work function material. Typically, the emitter (109) is composed of, or comprises, lanthanum hexaboride, calcium aluminate electride, or a porous metal matrix, optionally a tungsten matrix, impregnated with at least one of, or a mixture of one or more of, ceramic inorganic oxides, optionally selected from barium oxide, calcium oxide, scandate and alumina. Most typically, lanthanum hexaboride (Lab6) is used for a high current (>20 A) cathode tube (107) in the hollow cathode apparatus (100).

The emitter (109) is dimensioned so the surface area is sufficient to meet the emission requirements at the operational temperature. The remaining components of the hollow cathode apparatus (100) are dimensioned accordingly relative to the emitter (109) dimensions. Only a portion of the total surface area of the emitter (109) is active, i.e. thermionically emitting, in use and primarily the thermionic emission of electrons is from the internal cylindrical surface of the emitter (109) into the hollo cavity containing the gas to be ionised to form a plasma. In addition, the operating temperature is directly linked to potential lifetime of the hollow cathode apparatus (100) and therefore, as known to those skilled in the art, the emitter (109) is dimensioned based on a combination of interdependent parameters.

A sleeve layer (105) is sandwiched between the cathode tube (107) and the emitter (109). The sleeve layer (105) is composed of an electrically conductive material and electrically connects the emitter (109) to the cathode tube (107). The sleeve layer (105) may be composed of, or may comprise, graphite or rhenium. When Lab6 in particular is used as the emitter material, the emitter material is preferably mechanically separated from the cathode tube by the sleeve (105) to reduce boron diffusion from the emitter (109). The sleeve layer (105) has a small thickness and is typically made of graphite that has been baked at high vacuum to remove impurities. The sleeve layer (105) is provided for some emitter materials, e.g. LaB6, and calcium aluminate, to function as a contact barrier to stop chemical reactions from the emitter to the cathode tube. For emitter materials, e.g. barium oxide impregnated on tungsten, the sleeve layer (105) is not needed and hence omitted.

Accordingly, the HHC apparatus (100) comprises a conductive cathode tube (107) which provides an electrical path for the low work function emitter (109), which is positioned at the downstream (with respect to the input gas flow into the cavity (8)) end (4) of the cathode tube (107). The internal diameter (ID) of the cathode tube (107) is set by the dimensions of the emitter (109). Typically, the outer diameter (OD) of the cathode tube (107) is as small as possible to minimise heat conduction, but must be structural supportive. Finally, the length of the cathode tube (107) is significantly larger than the internal diameter (ID) to mitigate heat conduction along the cathode tube (107), but again must be structurally supportive. The cathode tube material is selected for the high temperature operating characteristics of the low work function emitter (109). In addition, the attribute of low thermal conductivity is preferred to minimise the thermal losses. Typically, refractory metals, such as molybdenum, tantalum or rhenium, or any combination thereof, or alloys such as molybdenum-rhenium, are used for the conductive cathode tube (107).

The end of the emitter (109) can be open ended, or can be concealed by a higher work function material, such as tungsten or molybdenum, or a dielectric material. Accordingly, in the illustrated embodiment an end cover (104) covers an end surface (38) of the emitter (109). The end cover (104) may be composed of, or may comprise, an electrically conductive metal, or a dielectric material selected from a ceramic material or a glass material. The electrically conductive metal may be selected from tungsten, molybdenum, graphite, rhenium or the ceramic or glass material may be selected from alumina, zirconia, silicon nitride, boron nitride, a glass ceramic, or macor, or any combination thereof.

Concealing the emitter end surface (38) inhibits the discharge attachment on that emitter end and therefore the discharge attaches mainly on the emitter inner surface in steady state operation, thus utilising the hollow cathode effect. This can result in reduced and more uniform erosion of the emitter surface during steady state operation. The emitter inner diameter (ID) and length determine the emission surface size and that is set by the emission current, and the operational temperature required. The operational temperature and outer diameter (OD) of the emitter (1090 are determined by the lifetime and power limit of the system required.

An outer tubular dielectric barrier (110) circumferentially surrounds an outer tubular surface (16) of the cathode tube (107). The outer tubular dielectric barrier (110) is composed of a barrier material which is electrically non-conductive. The outer tubular dielectric barrier (110) includes a flanged end region (18) which surrounds an end surface (20) of the cathode tube (107) at the output end (4).

The hollow cathode apparatus (100) preferably further comprises an inner tubular dielectric barrier (108) circumferentially surrounding a surface portion (90) of the inner tubular surface (14) of the cathode tube (107). The surface portion (90) is adjacent to the tubular emitter (109), and is between the emitter (109) and the input end (2). The inner tubular dielectric barrier (108) is composed of a barrier material which is electrically non-conductive. The inner tubular dielectric barrier (108) is not essential and may be omitted so that the outer tubular dielectric barrier (110) is provided as a sole dielectric barrier on the cathode tube (107).

The outer and inner tubular dielectric barriers (110, 108) form dielectric sleeves covering the exposed cylindrical surfaces of the cathode tube (107). Typically, the barrier material of the outer and inner tubular dielectric barriers (110, 108) which is electrically non-conductive is composed of, or comprises, a dielectric material selected from a ceramic material or a glass material. The ceramic material or glass material may be selected from alumina, zirconia, silicon nitride, boron nitride, a glass ceramic, or macor, or any combination thereof. Macor is a machineable glass-ceramic developed by Corning Inc. which is composed of fluorphlogopite mica in a borosilicate glass matrix, and has a composition of approximately (by weight %) 46% silica ($SiO_2$), 17% magnesium oxide (MgO), 16% aluminium oxide ($Al_2O_3$), 10% potassium oxide ($K_2O$), 7% boron trioxide ($B_2O_3$), and 4% fluorine (F). Typically, the tubular dielectric barrier (110, 108) has a thickness of from 0.1 to 5 mm, further optionally from 01.5 to 2 mm. The outer and inner tubular dielectric barriers (110, 108) may be in the form of a paste, which is typically painted onto the cathode tube (107). A typical paste thickness is from 0.5 to 1 mm.

Therefore, to suppress the attachment of the diffusive discharge to the cathode tube (107) during the ignition process, a non-conductive barrier (110), and preferably also barrier (108), is provided. This results in the cathode plasma attachment during ignition to the emitter (109) only; as such, the cathode heat flux is only distributed into the emitter (109) and not the cathode tube (107), directly heating the emitter (109). Discharge ignition is possible without direct plasma heating, but it is significantly less power efficient than when directly heating the emitter (109). The outer barrier (110) can also be a support for radiation shielding, as described below. The barrier material must be able to withstand the temperature of the cathode tube (107) and be electrically non-conductive. The barrier material either can be solid, such as an alumina, boron nitride, macor, or can be a high temperature ceramic paint such as zirconia paste.

A tubular cathode electrode (103) circumferentially surrounds the cathode tube (107). The tubular cathode electrode (103) has a tubular body (22) circumferentially surrounding the outer tubular surface (16) of the cathode tube (107) and the outer tubular dielectric barrier (110). A flange (24) covers the output end (4) of the cathode tube (107) and defines an output orifice (26) within the flange (24). The output orifice (26) is in aligned with, or concentric with, the end portion (10) of the central hollow cavity (8).

The tubular cathode electrode (103) and the cathode tube (107) are separated by an electrical insulation material (112) provided therebetween at, or in the vicinity of, the input end (2) of the cathode tube (107).

The cathode electrode (103) is optionally connected in one part to the cathode tube (107), such that the output end (4) of the cathode tube has an orifice (26). However, separating the cathode electrode (103) and the cathode tube (107) as illustrated by having the cathode tube (107) flanged upstream and isolated via an isolating washer of the electrical insulation material (112) allows for control of the electrical potential applied to the orifice (26) with respect to the emitter (109).

Preferably, a tubular keeper electrode (102) circumferentially surrounds the tubular cathode electrode (103). The tubular keeper electrode (102) has a tubular body (28) circumferentially surrounding an outer tubular surface (30) of the tubular cathode electrode (103), and a keeper flange (32) covering the flange (24) of the tubular cathode electrode (103). The keeper flange (32) defines a keeper output orifice (34) within the keeper flange (32). The keeper output orifice (34) is aligned with, and has a larger width (i.e. diameter when circular) than, the output orifice (26) of the tubular cathode electrode (103).

The tubular keeper electrode (102) and the tubular cathode electrode (103) are separated by an electrical insulation material (111), in the form of an isolation washer, provided therebetween at, or in the vicinity of, the input end (2) of the cathode tube (107).

A radiation shielding layer (106) is provided adjacent to the outer tubular dielectric barrier (110), and the radiation shielding layer (106) circumferentially surrounds the cathode tube (107). Preferably, the radiation shielding layer (106) is sandwiched between the outer tubular dielectric barrier (110) and the cathode tube (107), but may alternatively be located on the outside of the outer tubular dielectric barrier (110). The radiation shielding layer (106) may alternatively be located between the sleeve layer (105) and the cathode tube (107). The radiation shielding layer (106) may be composed of, or may comprise, a metal foil. The metal foil may be selected from molybdenum, tantalum or rhenium.

Accordingly, the radiation shielding layer (106) is located around the cathode tube (107) to minimise radiative thermal losses. The radiation shielding layer (106) is typically a very thin foil rolled many times around the cathode tube (107), for example approximately 15 times. The thickness of the radiation shielding layer (106) is typically approximately 0.025 mm, and the length is in the order of twice the length of the emitter (109). The radiation shielding layer (106) can additionally be placed around the outer dielectric barrier (110). However, due to the typical high emissivity of high temperature non-conductive materials suitable for use as the radiation shielding layer (106), it is preferred to be placed directly on the cathode tube (107) to minimise thermal losses. The radiation shielding material is chosen to withstand the high temperatures of the emitter (109) and have low emissivity; typically molybdenum or tantalum foil is chosen.

An end wall (40) is provided at the output end (4) of the cathode tube (107), is part of the cathode, and additionally functions as a mounting base for the hollow cathode apparatus (100). The end wall (40) closes the hollow cavity (8). A supply conduit (114) is provided for inputting the input gas (115) into the hollow cavity (8), the supply conduit (114) having an outlet opening (44) located in the end wall (40). In use, both the mounting base and conduit connect to a vacuum chamber mount and propellant system (neither being shown in the Figures).

Preferably, the conductive cathode tube (107) is provided with a flanged end, at the upstream end with respect to the flow of input gas (15) into the cavity (8). Accordingly, the cathode tube (107) further comprises a radially outwardly directed flange (46) at the input end (2) of the cathode tube (107). The outwardly directed flange (46) is fitted to the end wall (40) of the hollow cathode apparatus (100). Preferably, the tubular cathode electrode (103) and the tubular keeper electrode (102) are provided with corresponding outwardly directed flanges (48, 50) in the vicinity of the outer end (4) of the cathode tube (107). The flanges (46, 48, 50) are mutually and respectively separated by the electrical insulation materials (112, 111) in the form of electrically isolating washers.

The heaterless hollow cathode (100) is accordingly mounted on a mounting flange (113) of the end wall (40), which supports the hollow cathode apparatus (100), maintaining the concentric positioning of the tubular components, and also makes union to the propellant line (114). The propellant line (114) is typically welded to the mounting flange (113), both of which are typically made of stainless steel or Kovar. The mounting flange (113) allows connection to a given chamber mounting system and provides electrical mounting points for the various electrodes in the hollow cathode apparatus. The propellant line (114), which is typically in the order of a 3.2 mm (⅛ inch) pipe, gives the connection point to the propellant system, which provides and regulates the input gas (115).

The system of the preferred embodiment of the present invention comprises, in addition to the hollow cathode apparatus (100), a tubular anode (101) which is spaced from, and preferably coaxial with, the output end (4) of the tubular cathode (107). Such a system can simulate the operation of a propulsion system, or alternatively be incorporated into a propulsion system.

In the illustrated embodiment, the anode (101) is tubular but in alternative embodiments the anode (101) may have a different shape and configuration, for example in the form of a plate or cone, and in some applications the plasma beam itself can function as the anode.

As described above, the anode (101) is used to extract the current from the cathode (107). The anode (101) simulates the operation with the propulsion system, such as the Hall Effect Thrusters and Gridded Ion Engines which is the intended application of the heaterless hollow cathode apparatus of the present invention. The anode (101) is typically composed of metal or carbon, and is preferential to have a cylinder as this enhances the power performance by allowing a greater surface area attachment. The internal diameter (ID) of the anode (101) is preferably approximately from 2 to 4 times the outer diameter (OD) of the keeper orifice (34) and the length of the anode (101) is preferably approximately from 2 to 4 times that of the cathode tube (107), although the anode dimensions are also dependent on emission current. Large emission current operation can require water cooling of the anode (101). The anode-cathode separation distance is typically approximately from 5 to 15 mm.

The hollow cathode apparatus (100) is configured to supply a high current which passed to the anode via the plasma discharge. In FIG. 1A the apparatus as shown is in an anode configuration as an example, since the plasma plume is illustrated, which simulates the HHCs main operation in a propulsion or thruster, with the hollow cathode apparatus functioning as the discharge or neutraliser cathode.

Electrical circuitry (50) is connected between the hollow cathode apparatus (100) and the tubular anode (101) for connection to a source (205, 206) of electrical power for providing an electrical potential between the cathode (107) and anode (101) to cause an electric current to pass from the emitter (109) into the input gas (115) to form a plasma (6) which is then output through the output end (4) of the cathode tube (107) to form a plasma plume (52).

The electrical circuitry (50) is designed to provide the required control of the current through ignition in a passive and low power usage manner, forming a diffuse plasma discharge, without current surges, that minimise thermal shock and erosion of the emitter (109) during ignition. This electrical circuitry (50) is designed to require only two, standard off the shelf laboratory power supplies, thus allowing cost effective incorporation of the heaterless hollow cathode apparatus (100) into the given propulsion system, or propulsion testing system.

The electrical circuitry (50) comprises a first, ignition, power supply (54) for connecting the cathode (107) and the cathode electrode (103) to a first source (206) of DC power in an ignition power mode and a second, steady state, power supply (56) for connecting the anode (101) and the cathode (107) to a second source (205) of DC power in a steady state power mode.

In the illustrated embodiment, the first source (206) of DC power and the second source (205) of DC power are provided by separate DC power sources, but in an alternative embodiment the first source (206) of DC power and the second source (205) of DC power may be provided by a common DC power source.

The first source (206) of DC power and the second source (205) of DC power may optionally be respectively provided by one or more capacitor(s), or by any other source of electrical power.

The first power supply (54) comprises a current control device (58) which is adapted to control the current between the cathode (107) and the cathode electrode (103). The current control device (58) is arranged to function as an anti-surge current stabiliser during the ignition power mode. The current control device (58) is arranged to function, during the ignition power mode, as an anti-surge current stabiliser during initiation of a discharge and to stabilise the current during a subsequent secondary electron emission discharge. The current control device (58) is arranged to decrease in electrical resistance with increasing current between the cathode (107) and the cathode electrode (103) during the ignition power mode.

The current control device (58) can therefore function:
a) As an anti-surge current stabiliser during initiation of the discharge, which this stops the high current during the breakdown surge;
b) To provide current stabilization of the secondary electron emission sustained discharge, which stops the discharge changing to a non-uniform discharge; and
c) To control the power input through ignition, which allows control of the emitter heating rate, and therefore how quickly the cathode device is started, a gradual increase in power being preferred.

The current control device (58) is arranged to control the current between the cathode (107) and the cathode electrode (103) to a predetermined maximum threshold, typically to a maximum threshold current of 500 mA, for example within a range of from 10 to 500 mA. The current control device (58) may comprises a resistor, preferably a thermistor (203) or a plurality of thermistors (203), an inductor (204) or a plurality of inductors (204), or a combination of at least one thermistor and at least one inductor in series. In the illustrated embodiment, the current control device (58) comprises a resistor, optionally a thermistor (203) or a plurality of thermistors (203), and an inductor (204) or a plurality of inductors (204) in series. A diode (not illustrated) is optionally used to prevent reverse current flow from the keeper electrode (102) to the cathode (107), this diode is placed in series with the thermistor (203) and/or inductor (204) in the circuit, and directed to ensure electron flow in the direction of from the cathode (107) to the keeper electrode (102), as is conventionally known in the art.

The first power supply (54) comprises a first electrical conductor (60) for electrically connecting a first terminal (62), which is at a negative DC potential, of the first source (206) of DC power to the cathode (107), and a second electrical conductor (64), including the current control device (58), for electrically connecting a second terminal (66) which is at a positive DC potential, of the first source (206) of DC power to the cathode electrode (103). The first electrical conductor (60) can be grounded to ground (207). The second electrical conductor (64) includes a first switch (201) which can selectively open or close the electrical connection between the second terminal (66) and the cathode electrode (103). The first switch (201) is a two way switch for selectively opening the electrical connection between the second terminal (66) and the cathode electrode (103), and thereby short circuiting the cathode (107) and cathode electrode (103) via a third electrical conductor (68) connected between the first switch (201) and the first electrical conductor (60).

A fourth electrical conductor (70) includes a second switch (202) for selectively electrically connecting the second terminal (66) to the cathode electrode (103) thereby to bypass the current control device (58).

The keeper electrode (102) is connected by a fifth electrical conductor (72) electrically connecting the keeper electrode (102) to a junction (74) between the first switch (201) and the second switch (202), thereby connecting to the second terminal (66) via the current control device (58).

The second power supply (56) comprises a sixth electrical conductor (80) for electrically connecting a first terminal (82), which is at a negative DC potential, of the second source (205) of DC power to the cathode (107), optionally connecting to the first electrical conductor (60), and a seventh electrical conductor (84) for electrically connecting a second terminal (86) which is at a positive DC potential, of the second source (205) of DC power to the anode (101).

In use, the cathode tube (107) is at the same electrical potential as the emitter (109), and both of the cathode tube (107) and the emitter (109) are electrically negative with respect to the anode (101), and, when present, the optional cathode electrode (103) and associated orifice (26) and, also when present, the optional keeper electrode (102) and associated orifice (34).

The emitter (109) can be floating negative, as the emitter (109) is attached to the negative of the ignition supply (206), and anode supply (205) or can be optionally grounded to ground (207). The ignition supply (206) is a DC power supply, with typically an electrical potential of from 500-1000V, and a current of from 2-5 A. The ignition supply (206) is connected in series to a current inrush control system, which in this example is depicted as a thermistor (203) and inductor (204), arranged in series electrically.

Current inrush control is provided to limit the current spike that can occurs during ignition, resulting in high energy arcing and melting. There are multiple ways of controlling the current ramp up, and the power supply can be designed such that there is a low capacitance inhibiting this inrush current. However, the specific current inrush control, using a current control device as described with respect to the preferred embodiment of the present invention, provides a cost-effective and technically straightforward solution to controlling the current ramp up with standard off-the-shelf components.

In addition to controlling the in-rush current, the overall electrical system must provide adequate electrical resistance to sustain a low current (50-500 mA), relatively low voltage (300-400V) diffusive discharge during ignition; otherwise, the discharge can localise and cause non-uniform erosion.

The thermistor (203) typically provides a selected resistance prior to ignition, and was found preferably to be from 500-900 ohm to ensure reliable ignition. Then, as the current increases the resistance drops substantially, essentially removing resistance from the circuit, so as not to result in a large power loss during ignition. Ballast resistors could be used instead, as has commonly been used with known heaterless hollow cathodes, though this would result in large power losses during and post ignition.

In combination with the thermistor/ballast, or instead of these components, an inductor (204) can be used which dampens the current change and helps stabilise the discharge.

Both the inductor (204) and thermistor (203) can be removed from the circuit post-ignition with switch (202). With this switch (202) closed, the system then is operating without any additional external power loss. In addition, the cathode orifice (26) can be electrically connected to the cathode (107), or made to float via an additional switch (201) resulting in the transfer of the discharge from the cathode orifice (26) to the keeper orifice (34) or direct to the anode (101).

The anode power supply (205) applies a potential to the anode (101) relative to the cathode (107), extracting the current from the heaterless hollow cathode (100), this anode power supply (205) can be a high current supply depending on the discharge current required.

In the method of operating a system according to the present invention, input gas is injected into the central hollow cavity.

Then, in an ignition step, the cathode and the cathode electrode are electrically connected to the first source of DC power to apply an electrical potential between the emitter and the output orifice of the cathode electrode to cause a discharge in the input gas to heat the emitter. Preferably, in the ignition step the current between the cathode and the cathode electrode is controlled by the current control device to a predetermined maximum threshold. The current is typically controlled to a maximum threshold current of 500 mA, and is further preferably within a range of from 10 to 500 mA.

In the ignition step preferably the electrical potential is controlled to cause the discharge initially to be constituted by a Townsend discharge which transitions into a sustained secondary emission discharge which heats the emitter via ion bombardment. In the ignition step, preferably the cathode, the tubular cathode electrode and the keeper cathode electrode are electrically connected to the first source of DC power to apply an electrical potential between (i) the emitter and (ii) the output orifice of the cathode electrode and the keeper output orifice of the keeper cathode electrode.

Optionally, after the ignition step the emitter and the output orifice of the cathode electrode are electrically shorted to remove any electrical potential therebetween.

Thereafter, in a subsequent steady state power step, the anode and the cathode are electrically connected to the second source of DC power to apply an electrical potential between the emitter and the anode to cause a discharge in the input gas to form a plasma flume which is outputted through the output end of the cathode tube. Preferably, the electrical potential is maintained between the emitter and the keeper output orifice of the keeper cathode electrode to cause a keeper discharge between the emitter and the keeper output orifice. Optionally, after commencement of the steady state power step, the electrical potential between the emitter and the keeper output orifice of the keeper cathode electrode is switched off to terminate the keeper discharge between the emitter and the keeper output orifice.

The ignition of the heaterless hollow cathode (100) can be ignited between the cathode orifice (26) and the emitter (109) without requiring the reduction of the keeper orifice (34), as is common with known heaterless hollow cathodes. This circumvents the common electron extraction efficiency issue with having a decreased keeper orifice. The cathode orifice electrode (103) can be made from the same material as the cathode tube (107). Additionally to metals, graphite has been used, which can be beneficial due to the low sputtering yield, though it has been found to suffer from arcing.

The keeper electrode (102) is arranged concentrically around the cathode tube (107). The keeper electrode (102) is also flanged on one end, but has an orifice (34) on the other end which is downstream from the cathode orifice (26). This keeper electrode (102) helps stabilise the ignition prior to an anode discharge. The keeper electrode (102) is typically manufactured from a refractory metal such as tantalum, or molybdenum, though graphite is increasingly used due again to the low sputtering yield. The keeper electrode (102) is isolated from the cathode electrode (103) by another isolator (111) which can be made of a high temperature dielectric material such as alumina or boron nitride. The thickness of the isolators (111, 112) should be thicker than the thickness of the flanges, as progressively built-up depositions on dielectric material such as alumina can lead to electrical shorting after a long operating duration.

Where the discharge is initiated between the cathode orifice (103) and the emitter (109), the cathode orifice (26) is reduced in dimension so that flow is choked at that orifice (26), and the pressure is increased between the emitter (109) and the cathode orifice (26), close to the Paschen minimum.

This allows for ignition at nominal operating flow rates (<20 sccm) and reasonably low ignition voltages (<500 V). The edge of the cathode orifice (26) on the downstream side is chamfered to enhance the plasma optics through the orifice (26).

Alternatively with the discharge ignited from the emitter (109) to the keeper electrode (102), the cathode orifice (26) can be equal to the emitter internal diameter (ID), or smaller, though the keeper orifice (34) is reduced so that flow is choked at that orifice (34). This can result in higher anodic voltages due to the electron extraction optics through this reduced keeper orifice (34).

Figure 2A:
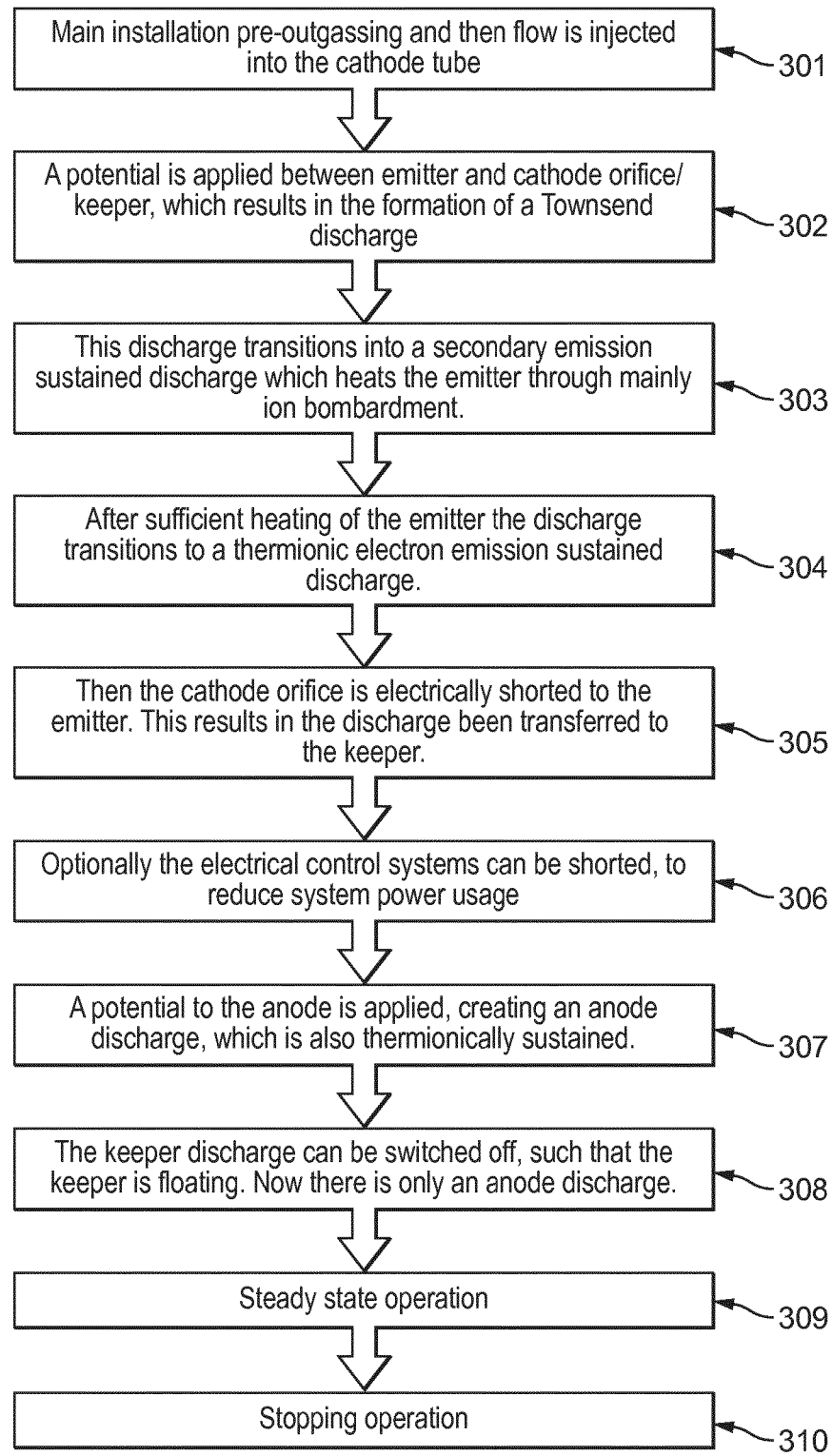
FIG. 2A is a process flow diagram illustrating the ignition procedure of the HHC apparatus of FIGS. 1A and 1B, the process flow diagram depicting the sequence of actions and events leading to the full ignition of the HHC apparatus.

The process of heaterless ignition of the HHC, as depicted in the process flow diagram of FIG. 2A, is now described in detail.

Initially, the hollow cathode apparatus (100) is installed in the propulsion system or in the anode configuration to be tested. If the cathode tube (107) has been exposed to atmosphere since the previous use, then the conditioning procedure (see FIG. 2B) is completed as a preliminary process prior to initiating the following steps (301) to (310).

Step (301) The gas flow (115) is injected into the cathode tube (107) through the propellant tube (114).

Step (302) After flow stabilisation, the ignition power supply (54) powered by the first source of DC power (206) is switched on with the current set at the nominal keeper current required. This operation is with the current control bypass switch (201) open, i.e. in the configuration illustrated in FIG. 1A, and the cathode orifice (26) is not directly connected electrically to the cathode tube (107). When the voltage is applied by the ignition power supply (54), this causes breakdown, and a Townsend discharge propagates though the gas from the emitter (109) to the cathode orifice (26). When the keeper orifice (34) is also provided, as shown in FIG. 1A, the discharge also propagates though the gas from the emitter (109) to the keeper orifice (34).

Step (303) Then a low current (50-500 mA), relatively low voltage (300-400V) steady state discharge forms, sustained by secondary electron emission, from the emitter (109) to the cathode orifice (26) and, when the keeper orifice (34) is also provided, as shown in FIG. 1A, the keeper orifice (34). These discharge current are shown respectively by current $I_o$ and current $I_k$. The current control device (58) provided by thermistor (203) and inductor (204), prevents a potentially highly erosive surge of current, which would otherwise occur due to the sudden drop in resistance across the cathode tube (107) and the cathode electrode (103) during breakdown, combined with the stored energy in the first source of DC power (206), which may be one or more ignition supply capacitor(s). In addition, the current control device (58), provided by thermistor (203) and inductor (204), controls the current during ignition, which is typically approximately from 250-500 mA, to be below predetermined threshold or within a predetermined range. The current control device (58) also functions to stabilise the discharge from forming possible localised discharges which are highly erosive. This discharge heats the emitter (109) with ion bombardment predominately, but also through plasma radiation and electron bombardment. The discharge therefore provides a "heaterless" hollow cathode apparatus, since the emitter (109) at the cathode (107) is heated by a discharge.

Step (304) Once the emitter temperature increases to a thermionic level, the discharge changes to a very low voltage, ~30 v, high current, 5 A discharge, which is subsequently sustained via thermionically emitted electrons. This is the nominal discharge mechanism for the emitter (109). This transition can be achieved within a time period of less than 1 second, dependent upon the electrical power applied. However, such a rapid transition can result in high thermal shock, and in addition can result in non-uniformity of the discharge. It was found that a heating time of approximately 50 seconds was sufficient to heat the emitter (109) to provide an effective and reliable "heaterless" hollow cathode apparatus.

Step (305) With the emitter (109) heated and the emitter temperature sustained via a discharge to the cathode orifice (26) and the keeper orifice (34), the cathode orifice (26) can be electrically shorted to the emitter (109) via the switch (201), or the cathode orifice (26) can be switched to an electrically floating position. This transfers the discharge to a completely keeper discharge at the keeper orifice (34).

Step (306) Optionally the current control device (58) can be electrically shorted by closing the switch (202) being closed, such that no excess power is wasted.

Step (307) The current required to be extracted to the anode (101) is set by the steady state, anode, power supply (56) powered by the second DC power source (205) and the electrical potential is applied, thus extracting the discharge to the anode (101). This discharge current is shown by current IA.

Step (308) After a short period of stabilisation, the keeper discharge can be switched off, via switching off the ignition power supply (56), and letting the keeper electrode (102) float electrically.

Step (309) The heaterless hollow cathode (100) is now working under nominal conditions, and can continue to operate as required.

Step (310) The apparatus is turned off by switching off the steady state, anode, power supply (56) powered by the second DC power source (205). Then the flow of input gas (115) is then stopped, and the apparatus is then in an OFF state. It is preferential to turn off the supply voltage prior to turning off the input gas flow, so that arcing does not occur as the pressure drops. If the thermistor (203) is used for discharge stabilisation, then the thermistor (203) should be allowed to cool-down, to regain its resistance before attempting re-ignition.

Figure 2B:
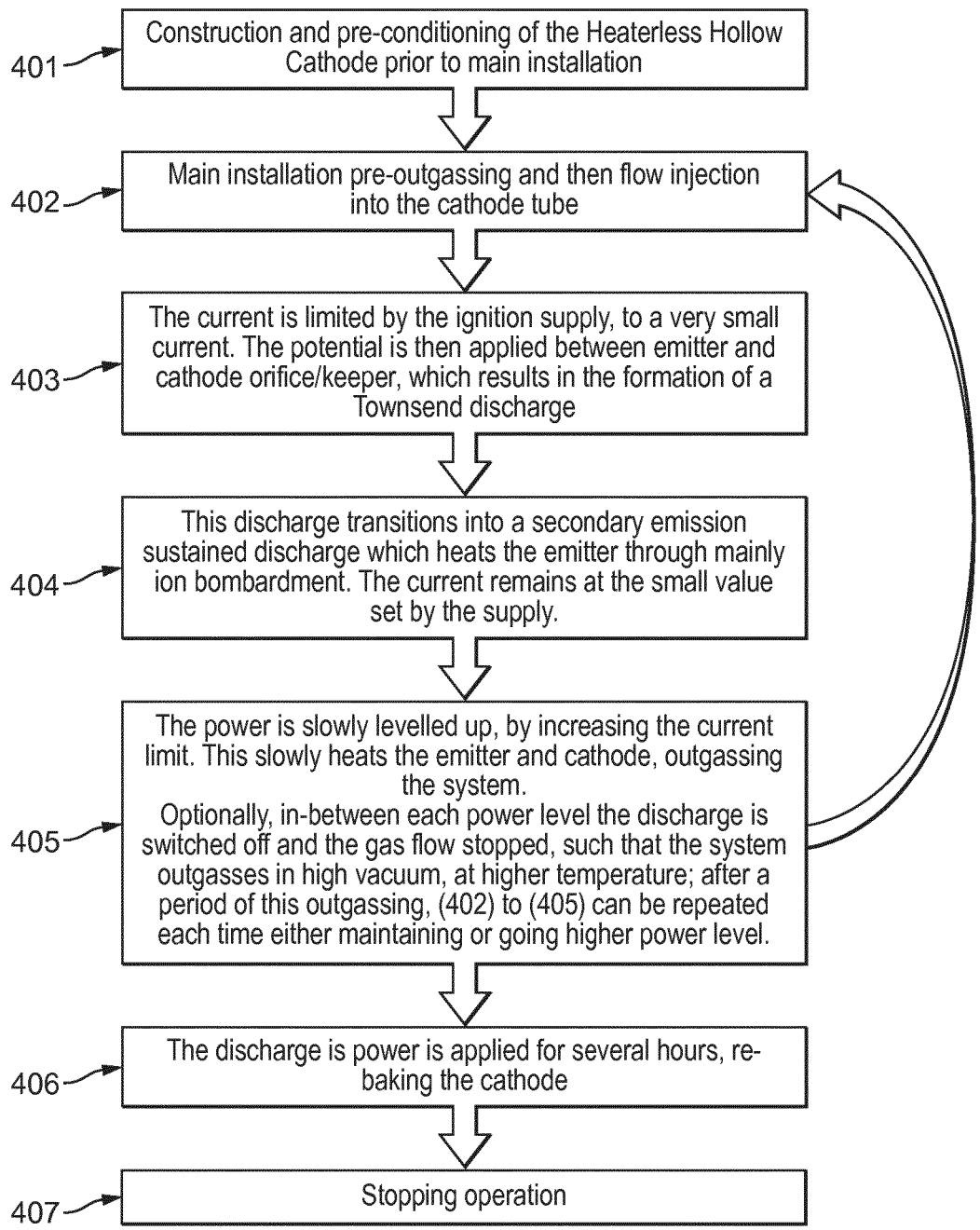
FIG. 2B is the a process flow diagram illustrating the conditioning procedure of the heaterless hollow cathode of the HHC apparatus of FIGS. 1A and 1B, after manufacture and prior to first ignition in either thruster or anode configurations.

The conditioning procedure is now described in detail. As described above, the heaterless hollow cathode may be subjected to a process of conditioning prior to operation to remove excess impurities in the system and reduce the possibility of emitter poisoning. Conditioning of a hollow cathode is a standard procedure for known conventional hollow cathodes. However, due to the use of heaterless ignition in the present invention, the Ohmic heater that typically is used to condition conventional cathodes is unavailable. Consequently, a heaterless conditioning process has been developed. As depicted in FIG. 2B this process comprises the following steps:

Step (401) For a newly constructed HHC, the pre-conditioning procedure can been completed first. The physical component parts of the hollow cathode may have impurities thereon left over from fabrication, which impurities need to be removed. First the component parts are cleaned in an ultrasonic bath for a period of about 30 minutes. Then the component parts are baked in a high vacuum atmosphere ($<1\times10^{-6}$ mbar) at a temperature of over 800° C. to outgases the system. This step can be carried out in a vacuum furnace, or with a heater element. This is particularly important for the emitter sleeve (105) as the impurities can result in poisoning of the emitter (109). The emitter (109) is subjected to the same cleaning process, although is done independently as to ensure that the impurities of the other parts do not poison the emitter (109). In addition, when the emitter (109) is vacuum baked, the temperature is slowly raised to remove any excess water vapour etc. at a low temperature, to ensure that emitter (109) is not poisoned. Once the cleaning procedure is completed, the HHC is assembled (or re-assembled).

Step (402) The HHC system is installed in a propulsion system or thruster, or in a simulated anode configuration. After the preceding step, the HHC has been exposed to atmosphere and thus must undergo the main conditioning treatment. This main conditioning treatment must be done each time the cathode (107) is exposed to atmosphere or low vacuum. The cathode (107) is first evacuated in high vacuum ($<1 \times 10^{-6}$ mbar) to start outgassing. This occurs for a sustained period of time (>4 hours), preferably overnight so that there is very low partial pressures of oxygen and water vapour within the HHC, which can result in poising of the emitter (109). Nitrogen backfilling of the chamber can reduce the time required for this process. After outgassing, gas is then injected into the cathode (109).

Step (403) The current is limited by the ignition supply, to a very small current <50 mA. The electrical potential is then applied between the emitter (109) and the cathode orifice (26)/keeper orifice (34), which results in the formation of a Townsend discharge.

Step (404) This discharge transitions into a secondary emission sustained discharge which heats the emitter (109) through mainly ion bombardment. The current remains at the small value set by the supply, such that the power to the emitter (109) is very small.

Step (405) The power is slowly levelled up, by increasing the current limit. This slowly heats the emitter (109) and cathode (107), increasing the outgassing of the HHC apparatus. Optionally, in-between each power level in step (405) the discharge is switched off and the gas flow stopped, such that the system outgasses in high vacuum, at the new higher temperature; after a period of this outgassing, the temperature will drop due to the discharge being off, and then steps (402) to (405) can be repeated each time either maintaining the power level, or increasing the power level.

Step (406) The discharge power is applied for several hours, re-baking the cathode (107), such that the HHC apparatus is ready for main operation.

Step (407) To terminate the conditioning operation, the ignition power supply (54) is turned off, then the input gas supply is stopped. Alternatively, the system can be fully ignited following the ignition procedure as described above.

The heaterless hollow cathode apparatus of a preferred non-limiting Example according to the present invention is now described in detail.

Example 1

An example of a prototype heaterless hollow cathode apparatus has been constructed and tested. The heaterless hollow cathode apparatus comprised the following components.

A stainless steel mounting flange was provided (to form end wall (40) and flange (113)), which was attached to a chamber mount (not illustrated) via mounting bolts (not illustrated) that were electrically isolated with ceramic alumina corner washers (not illustrated). The cathode propellant line (114) protruded from the rear of the mounting flange (113), and connected to a 3.2 mm (⅛ inch) Swagelok fitting (not illustrated), with a ceramic propellant tube isolator (not illustrated) placed upstream, that connected to the main propellant line (not illustrated) of the vacuum chamber (not illustrated).

A flanged molybdenum cathode tube (107) 70 mm in length with a 4.9 mm inner diameter and 6.9 mm outer diameter was secured to the mounting flange (113).

A lanthanum hexaboride (LaB6) low work function emitter (109) with an inner diameter of 2 mm, outer diameter of 4.5 mm, and a length of 20 mm was inserted into the end of the molybdenum cathode (107). A fine POCO graphite sleeve (105) was used to electrically connect, yet mechanically separate, the LaB6 emitter (109) from the refractory tube (107). The sleeve (105) was 20 mm long and 0.4 mm thick.

A macor ceramic casing, forming outer dielectric layer (110), supported a multi-layered tantalum thermal shield, forming shielding layer (106). The shield was 40 mm wide and 0.025 mm thick for each tantalum layer, and tantalum foil was wrapped around that cathode tube (107) about 15 times on the downstream end (4) of the cathode tube (107). The ceramic support casing, forming outer dielectric layer (110), completely covered the external surface of the cathode tube (107) to suppress discharge attachment during ignition. The ceramic support casing was 70 mm long, and 2 mm thick, with a flanged upstream end, forming end region (18) to secure to the cathode (107).

The cathode electrode (103) was electrically separated from the cathode tube (107) with an isolating disk (111) fabricated from macor and was 11 mm thick. The cathode electrode (103) was 64.9 mm long and had an inner diameter of 27 mm, and an outer diameter of 31.7 mm. The cathode electrode (103) was manufactured from POCO EDM-3 graphite. The end flange (24) of the cathode electrode (103) was 1 mm thick, with a 0.5 mm thick chamfered edge. The orifice hole (26) was varied, and was 0.25 mm in diameter for the test results shown in FIGS. 3 and 4 and 1.8 mm in diameter for the test results shown in FIG. 5. No keeper electrode (102) was used in this example prototype HHC and in addition, the orifice (26) was not concealed. The separation between the emitter (109) and cathode orifice (26) was 2 mm.

A cylindrical anode (101) was constructed from 316L stainless steel, with a 101.6 mm outer diameter, 3.05 mm wall thickness, and 100 mm length. The anode to cathode orifice separation was 10 mm.

An EA-PS 9750-12, 750V, 12 A power supply (54), applied an electrical potential between the cathode orifice (26) and the emitter (109). The negative emitter side was tied to earth/ground (207), and on the positive side there was an 800 ohm thermistor (203), and a 150 mH inductor (204) in series before the cathode orifice (26). No switches for shorting the thermistor/inductor or for shorting the cathode orifice (26) were used in the prototype.

An EA-PS 9200-70 (200V, 70 A) power supply (56) applied potential to the anode (101) with respect to the grounded emitter (109).

To start the HHC apparatus, the hollow cavity (8) was first evacuated in a high vacuum overnight at approximately $3 \times 10^{-7}$ mbar. Then 2 SCCM, (N4.8 Xenon), was injected into the hollow cathode (107), and after a period of about 20 seconds for pressure stabilisation, the EA-PS 9750-12 supply was turned on, and limited at 5 A, 700V. The discharge formed, heating the emitter (109).

Figure 3:
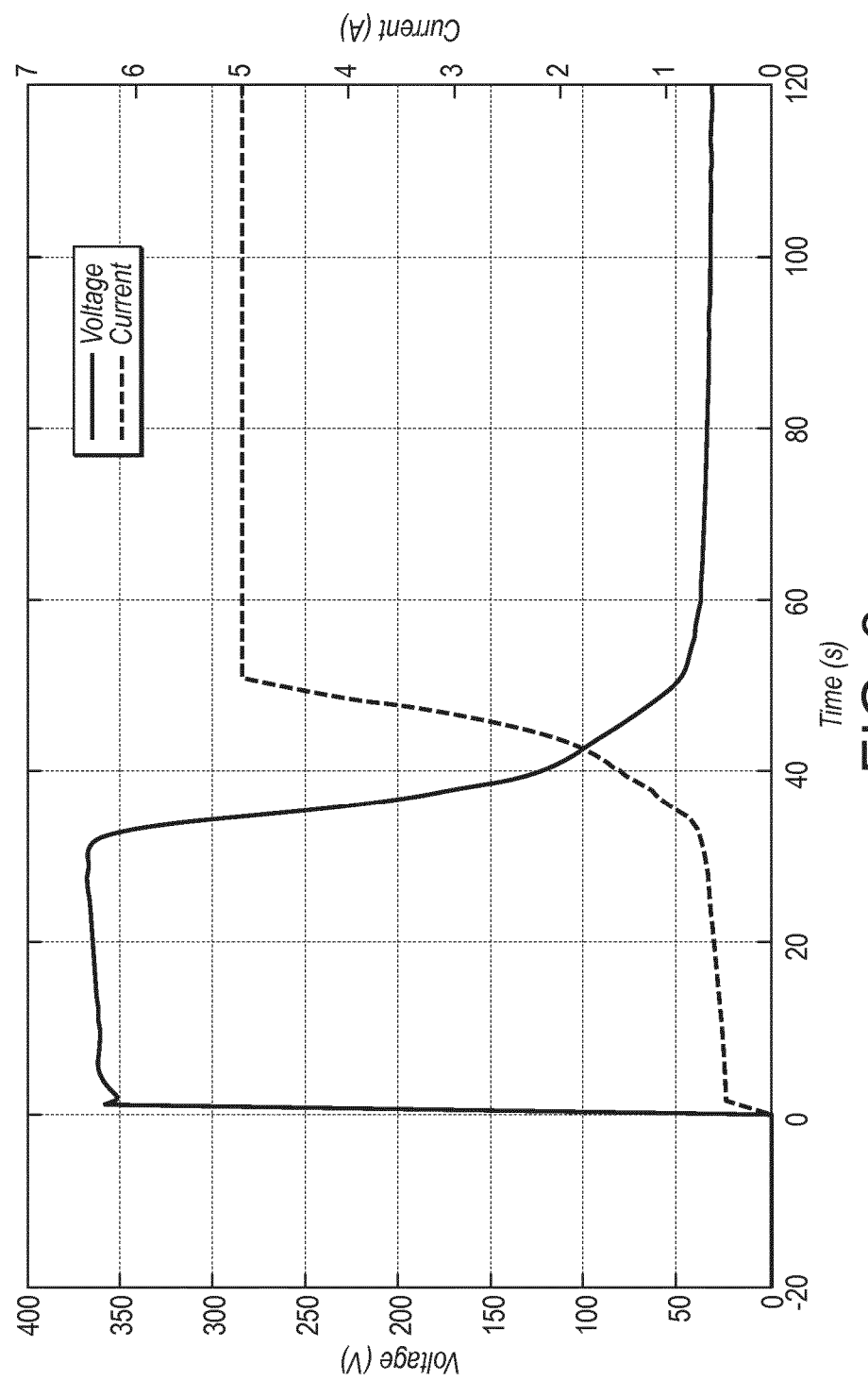
FIG. 3 is a graph illustrating an example of the voltage-current characteristic of the ignition process used for the HHC apparatus of FIGS. 1A and 1B.

The ignition voltage-current (V-I) characteristics are shown in FIG. 3, which shows an overview of the ignition phases. With breakdown there is the formation of the gaseous discharge with a power of around 150 to 240 W heating the emitter. As the emitter begins to non-negligibly thermionically emit, transition to the thermionic discharge occurs. Once compete, the device is in nominal thermionic operation. At which point an anode discharge can be ignited and the HHC can be operated as a conventional cathode.

Figure 4:
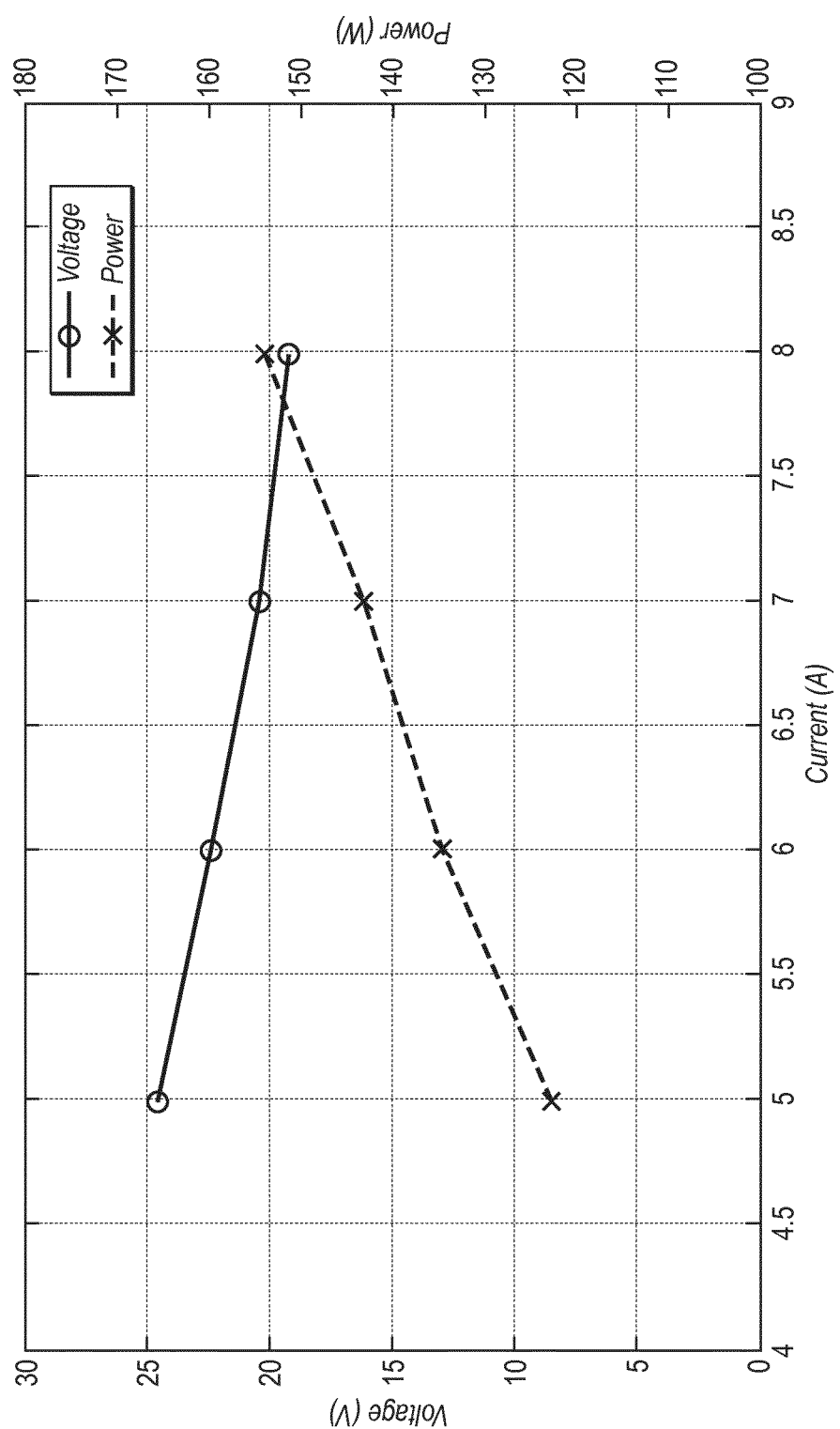
FIG. 4 is a graph illustrating an example of the post ignition keeper discharge characteristic, prior to transferring the discharge to the thruster or anode, of the HHC apparatus of FIGS. 1A and 1B.

After approximately 50 seconds, the emitter (109) attained an emission current of 5 A, and the HHC apparatus was ignited. The keeper discharge characterised as a function of current is shown in FIG. 4.

Figure 5:
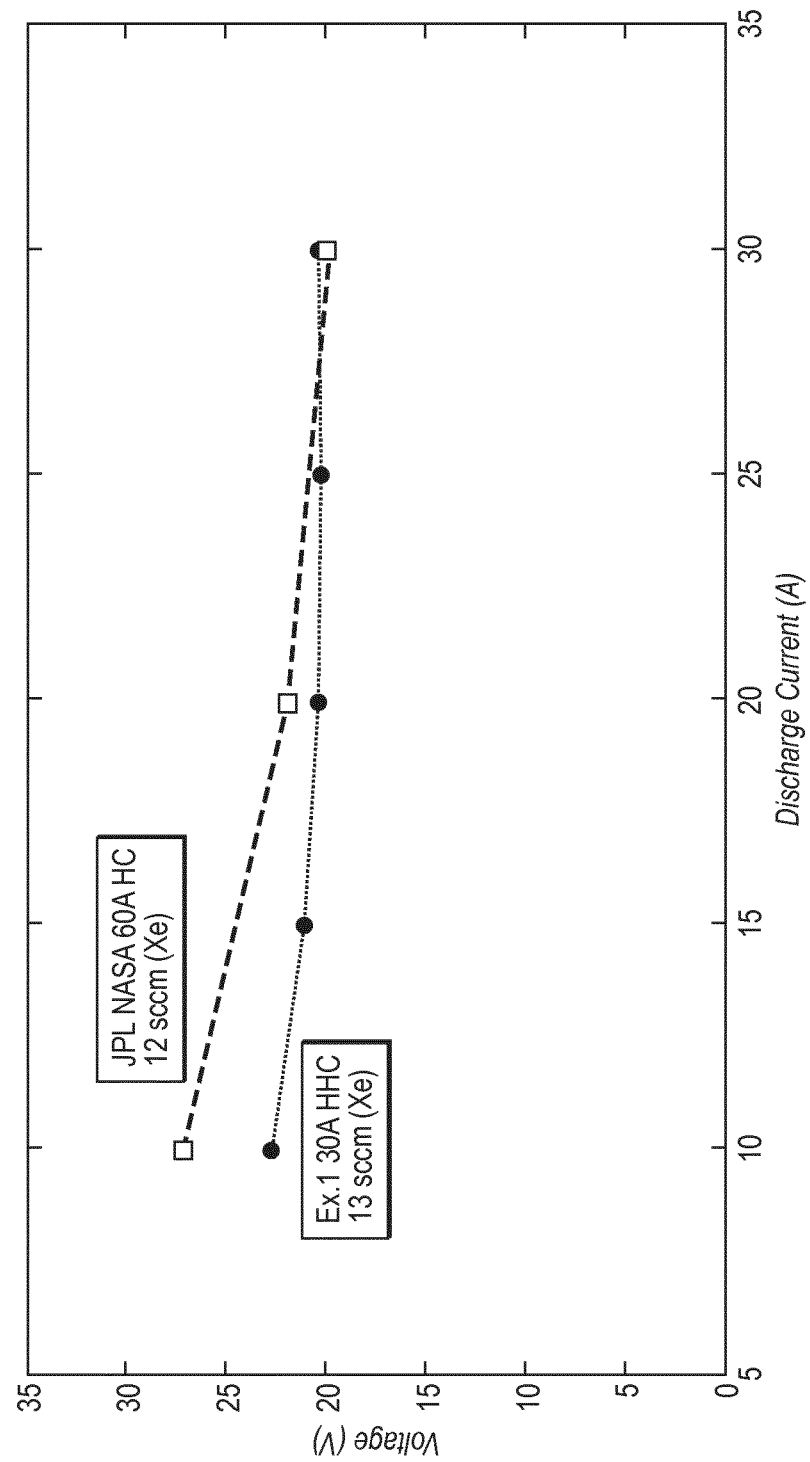
FIG. 5 is a graph illustrating an example of the discharge characteristics after transferring to an anode discharge, simulating in-thruster performance of the HHC apparatus of FIGS. 1A and 1B, the performance being compared with a well-established conventionally heated hollow cathode from JPL NASA.

Finally, the discharge was transferred to the anode by applying the EA-PS 9200-70 supply at 5 A, 100 V and switching off the ignition supply, such that the keeper voltage was floating. The main operation, with anode discharge currents of up to 30 A, is depicted in FIG. 5. This figure includes, as a comparison, the corresponding performance of a known heated hollow cathode developed by JPL NASA, it should be noted that exact quantifiable differences between the NASA cathode and this intentioned cannot be directly determined from this data, due to reasonable influence of testing conditions, including but not limited to the anode and chamber setup. Regardless the data illustrated in FIG. 5 demonstrated that the heaterless hollow cathode apparatus of the present invention has at least a reasonably comparable performance with that of a well-established conventional cathode, such that the heaterless hollow cathode apparatus of the present invention can utilise a heaterless ignition which does not degrade operational performance.

To initiate the HHC ignition process, gas was injected into the cathode-keeper region and a potential was applied to electrically breakdown the gas. To investigate the influences of pressure, gas species, and keeper-cathode separation $d_{c-k}$ on breakdown voltage and cold discharge, voltage ignition testing of the HHC was conducted.

The voltage between the cathode and keeper was increased at 500 V/s and current was limited to 10 mA. The breakdown triggered the oscilloscope trace, which was recorded and post-processed to determine the breakdown voltage. This breakdown testing was automated at each set point. $d_{c-k}$ was varied from 0.5 mm to 2 mm, in 0.5 mm intervals; this was repeated for pressures 4-8 mbar with krypton, argon and xenon. As breakdown is stochastic in nature, each set point was repeated at least 10 times. In total, including commissioning tests the system was subjected to approximately 800 breakdowns. The results are plotted in FIG. 6 for Kr, Ar, and Xe respectively.

Figure 6:
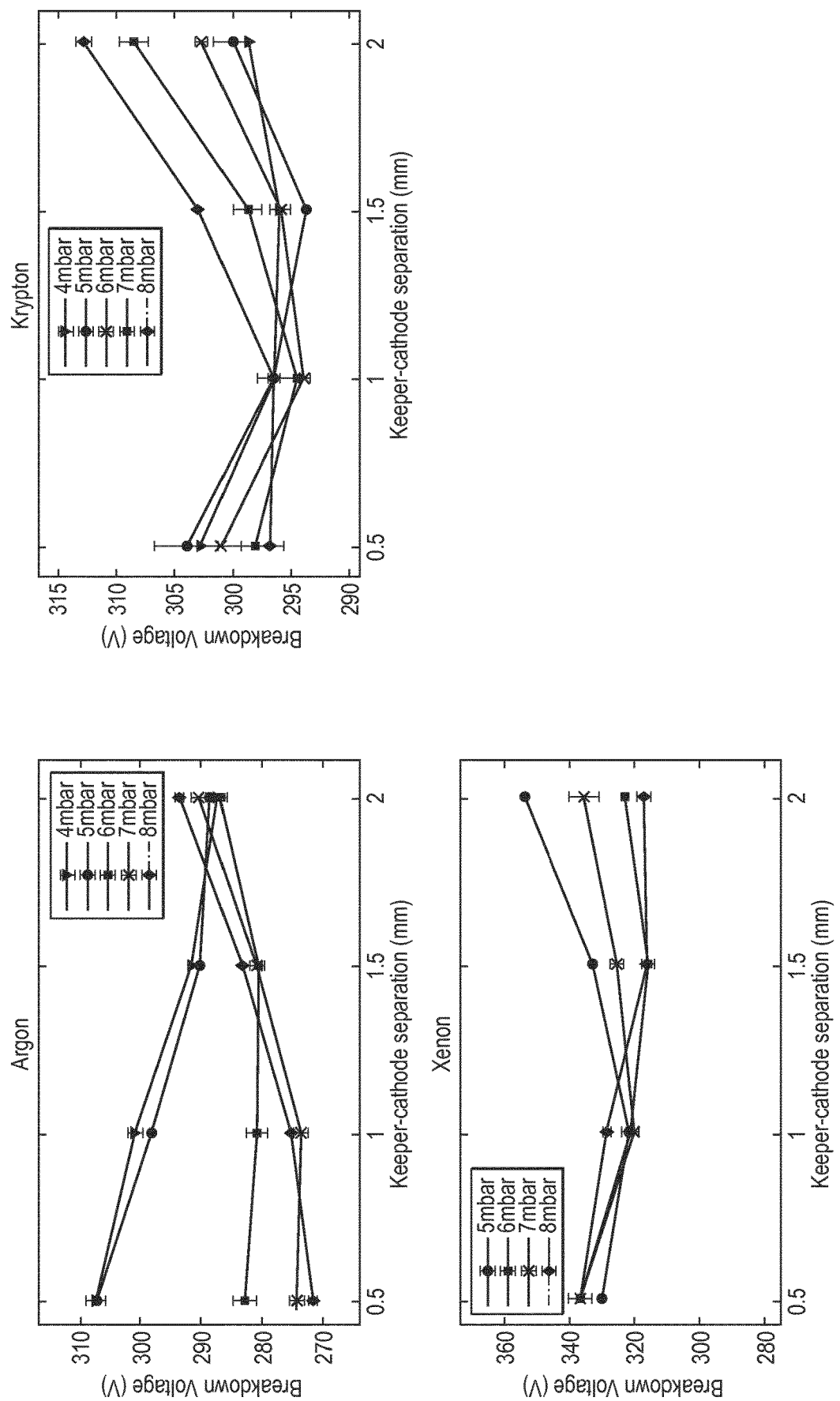
FIG. 6 comprises three graphs showing HHC breakdown characteristics for the gases argon, krypton, and xenon.

FIG. 6 shows the breakdown characteristics for krypton, argon and xenon. It can be seen that across the pressures there was a higher $V_b$ at the smallest and largest separation, $d_{c-k}$, and a $V_b$ minimum in-between. This is highly representable of classical Paschen breakdown, the relation is given by:

$$V_B = \frac{Bpd}{\ln(Apd) - \ln\left[\ln\left(1 + \frac{1}{\gamma_{se}}\right)\right]}$$

where A and B are gas properties determined experimentally which are constants over a reasonable range of E/p with units cm$^{-1}$ Torr$^{-1}$ and Vcm$^{-1}$ Torr$^{-1}$ respectively, d is separation and $\gamma_{se}$ is the secondary electron coefficient (see M. Lieberman and A. Lichtenberg, Principles of Plasma Discharges and Materials Processing. Hoboken: Wiley, 2005. and Y. Raizer, Gas Discharge Physics. Moscow: Springer-Verlag, 1987).

With conventional Paschen curves, the experiment is conducted with parallel plates; however, as the present breakdown tests were conducted using the heaterless hollow cathode, the geometry was more complex. This had two main influences, firstly of having non-uniform electric fields, and secondly, the cathode and keeper electrode surface protrude away from each other, such that $d_{c-k}$ is the minimum distance between the electrode surfaces, as it is possible to breakdown along the whole length of the emitter, $l_e$=20 mm. Due to the combined geometric electric field enhancements and relatively complex possible breakdown paths, it was challenging to determine experimentally the exact breakdown distance. Hence, the study focused on quantifying $V_b$ for practical conditions on the HHC.

It can be seen that the variance in the data is reasonably small for the pressure and distance within the range tested, which are typical operating ranges for the tested HHC. In addition, it was found to be evidentially possible to breakdown below 400 V for most practical configurations for all three gases.

A clear difference between the gases is apparent, with argon having the lowest breakdown voltages and xenon the highest. This is believed to due to the difference in mean free path of the molecules and electrons, of each gas species.

Table 1 highlights this, showing that the minimum reached breakdown voltage was 271 V for argon.

TABLE 1

Breakdown voltage summary

|  | Argon | Krypton | Xenon |
| --- | --- | --- | --- |
| $\overline{V_b}$ | 287 | 299 | 328 |
| $V_{b,min}$ | 271 | 293 | 316 |
| $V_{b,range}$ | 36 | 19 | 38 |

It should be noted that conventional hollow cathodes can be ignited at potentials <50V (see M. Praeger, A. Daykin-Iliopoulos, and S. Gabriel, "Vacuum current emission and initiation in an LaB6 hollow cathode," presented at the SPACE PROPULSION 2018, Seville, Spain, 2018) if sufficient thermionic emission is present (i.e. high enough heater power. Therefore these HHC potentials of Table 1 are approximately an order of magnitude higher than the HHC ignition potentials of conventional hollow cathodes. Considering this, the relative range of these potentials across the operating conditions, has limited impact on the power processing unit of the HHC. All parameters tested were close enough to $V_{b,min}$ to effective ignite the cathode, and hence can be chosen by heating/operational characteristics.

Visual inspection of the emitter before and after ~800 breakdowns could not find significant erosion, although the surface discoloration from original purple to blackish colour was observed, indicating perhaps deposit from the keeper to the emitter.

After breakdown occurs the discharge transitions to a cold discharge, sustained via secondary electron emission. The voltage for the cold discharge was measured in the same $V_b$ traces, averaged from 0.8-1 second after breakdown triggering. The current was limited to 10 mA for these discharges. The results can be seen in FIG. 7.

Figure 7:
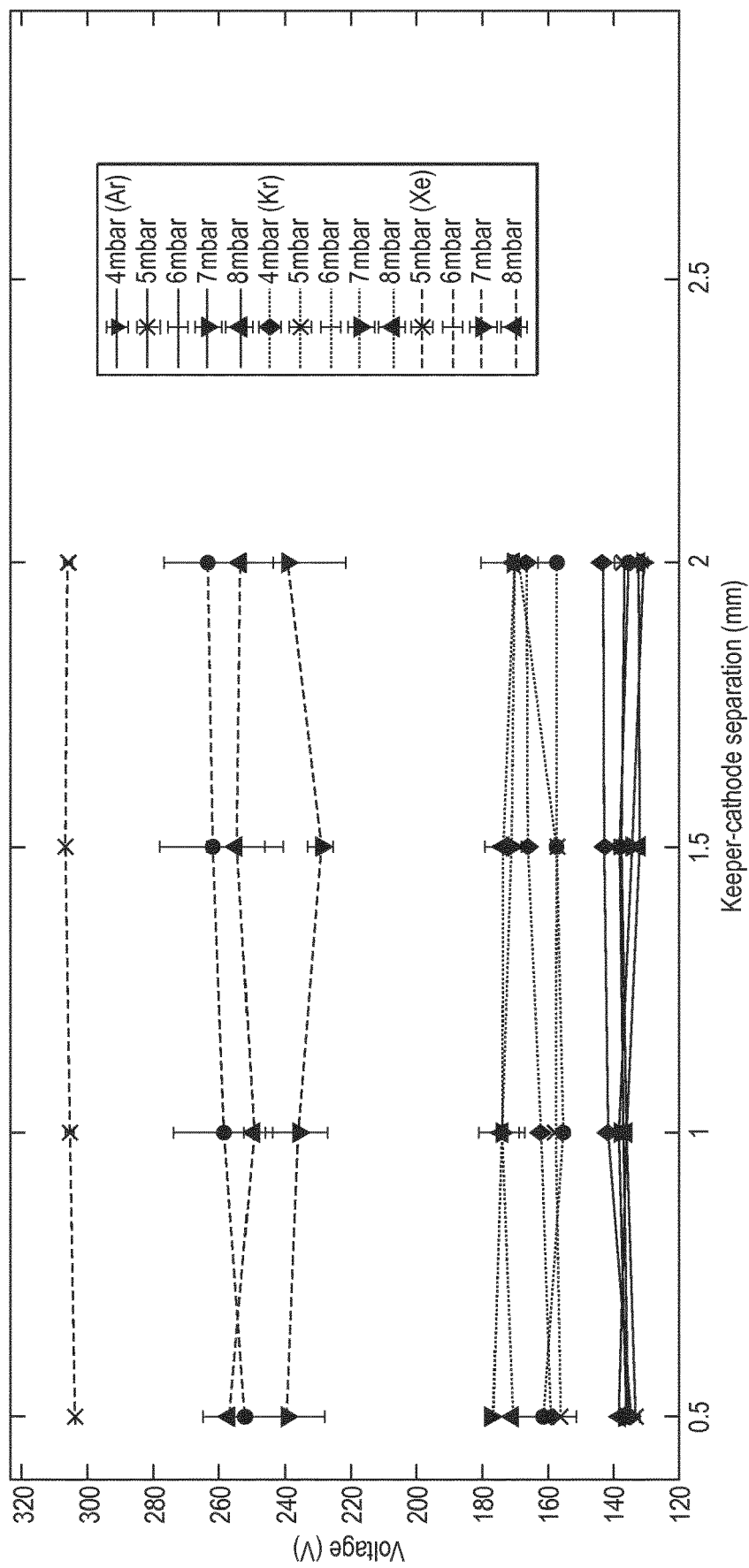
FIG. 7 shows HHC initial secondary electron emission sustained discharge characteristics for argon, krypton, and xenon.

It can be seen that the discharge voltage drops from the breakdown voltage, as less potential is required for the current generation due to space charge influence forming a sheath over the cathode, creating more efficient current generation. The discharge is enhanced further by the hollow cathode effect, and secondary emission coefficient of the emitter, which the Applicant believes has not been reliably reported for LaB6 heretofore. The separation of the cathode and keeper has minimal influence of the operating voltage as FIG. 7 shows, as the voltage drop is predominantly over the cathode sheath, such that increasing length only requires a small voltage increase to mitigate losses over the positive column (see Y. Raizer, Gas Discharge Physics. Moscow: Springer-Verlag, 1991).

Table 2 summarises the cold discharge results. It can be seen, as with the breakdown results, that the lowest potentials are for argon and highest for xenon; again this is due to the difference in mean free paths of the gas species. Additionally this results in higher potential drops from breakdown to cold discharge voltage.

TABLE 2

| | Cold discharge | | |
|---|---|---|---|
| | Argon | Krypton | Xenon |
| $\overline{V}$ | 136 | 165 | 263 |
| $V_{min}$ | 131 | 155 | 229 |
| $V_{range}$ | 12 | 21 | 78 |
| $\overline{V}_b - \overline{V}$ | 151 | 134 | 65 |

Comparative Example 1

A hollow cathode apparatus was provided with a cathode tube and a tubular emitter as described above with reference to FIGS. 1A and 1B, but however the hollow cathode apparatus was not provided with an outer tubular dielectric barrier composed of an electrically non-conductive barrier material circumferentially surrounding the cathode tube, i.e. inner and outer tubular dielectric barriers (108, 110) were not provided.

During the heating phase of the heaterless ignition of the hollow cathode apparatus, the discharge is sustained via secondary electron emission, as the emitter temperature is below the temperatures required for sizable thermionic emission. Hence during this phase, the discharge is not naturally limited to the low work function emitter and can attach over most of the cathode. As the current increases the discharge attaches to almost the entire conductive surface at cathode potential, in order to increase the secondary emission and thus sustain the increased current.

Figure 8:
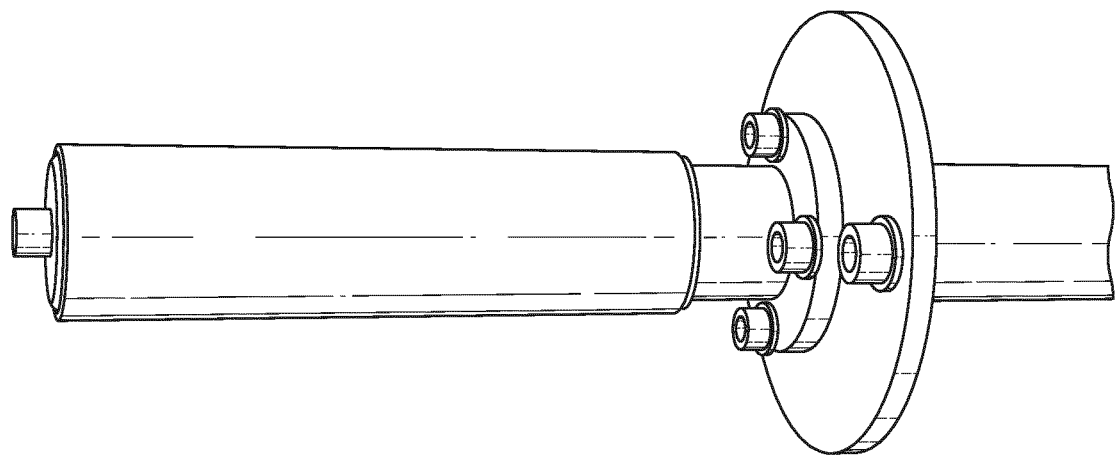
FIG. 8 is a perspective view of a heaterless hollow cathode apparatus not in accordance with an embodiment of the present invention showing the discharge when an outer tubular dielectric barrier is not present.

This discharge phenomenon is shown in FIG. 8, which shows a heating stage secondary electron emission sustained discharge, in a 5 mbar Ar backfilled environment with a 100 mA keeper discharge limit.

As can be seen from FIG. 8, the discharge has spread across the whole cathode tube and mount, the discharge even attaches to the rear of the mount. Discharge attachment spreading to the whole cathode tube and radiation shield results in reduced heating efficiency, as the heating power of the discharge spreads over a large surface area. In such cases the ignition can be challenging as parts of the heaterless hollow cathode apparatus, such as the stainless-steel mount, can potentially melt prior to the emitter reaching thermionic temperatures for transition to the nominal arc discharge.

Example 2

In accordance with one aspect of the present invention, the hollow cathode apparatus is provided with a cathode tube and a tubular emitter as described above with reference to FIGS. 1A and 1B, and additionally however the hollow cathode apparatus is provided with an outer tubular dielectric barrier composed of an electrically non-conductive barrier material circumferentially surrounding the cathode tube, e.g. inner and outer tubular dielectric barriers (108, 110) are provided. The outer tubular dielectric barrier can function to suppress parts of the diffusive discharge attachment and control the heat flux input through the heating phase. This is achieved through the use of a non-conductive sleeve placed on the exterior of the cathode tube.

Figure 9:
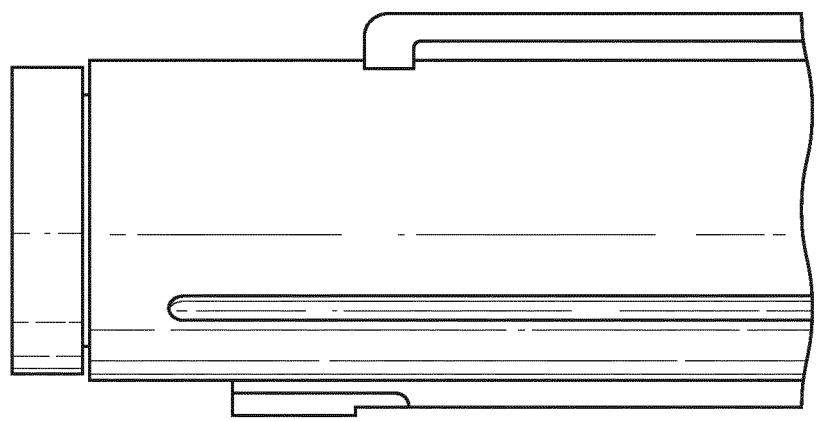
FIG. 9 is a perspective view of a heaterless hollow cathode apparatus in accordance with an embodiment of the present invention showing the discharge when an outer tubular dielectric barrier is present.

As shown in FIG. 9, which may be compared to FIG. 8 which does not have such a sleeve, the use of such a sleeve causes the discharge attachment to reside inside the hollow cathode and not on the exterior. This controlled plasma attachment enhances the heat flux input and supports a stable transfer to a thermionic discharge. The outer sleeve also acts as a support for the radiation shielding layer (106) as shown in FIGS. 1A and 1B. Overall the insulating casing suppresses discharge attachment to the exterior of the cathode during the heating phase, which enhances the power input into the emitter, minimising power usage and erosion. This controlled glow discharge heating, allows minimising of the thermal shock to the heaterless hollow cathode apparatus.

Comparative Example 2

Known heaterless hollow cathode apparatus have suffered heavy erosion and melting during start-up operation, as disclosed for example in Schatz, M, Heaterless Ignition of Inert Gas Ion Thruster Hollow Cathodes, 18th International Electric Propulsion Conference, Sep. 30-Oct. 2, 1985, Alexandria, USA. This problem is due to the process of "hard starts" in which electrical surges occur during the breakdown and heating phases, where uncontrolled high current pulses lead to vaporization of the electrodes. Additionally, any "soft starts" attempted by using ballast resistors resulted in unacceptable power losses for high current heaterless hollow cathode applications.

Figure 10:
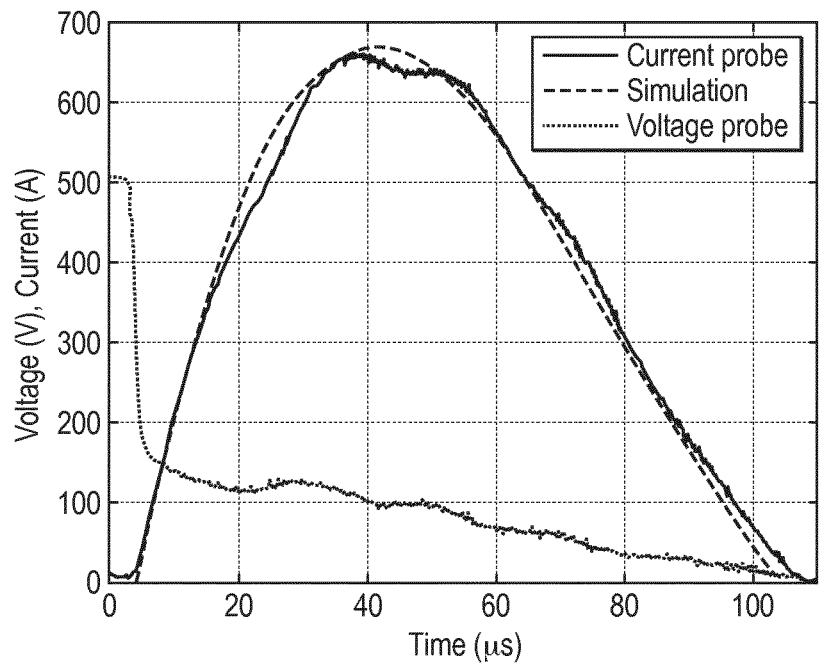
FIG. 10 is a graph showing the relationship between current and time and voltage and time during discharge for a heaterless hollow cathode apparatus not in accordance with an embodiment of the present invention.

The impact of the electrical discharge surge during breakdown without current control was measured for a heaterless hollow cathode apparatus having the structure shown in FIGS. 1A and 1B but without the electrical circuitry (50). FIG. 10 illustrates the relationship between current and time and voltage and time for the discharge. The power supply was set to 600 V with a 0.1 A current limit, with the cathode-keeper in an 8.5 mbar Ar, backfilled configuration with a 5 mm separation. As shown in FIG. 10, the electrical breakdown occurred at ~500 V (shown by the line marked "Voltage probe" in FIG. 10), which then induced a current peak of around 650 A within 40 s (shown by the line marked "Current probe" in FIG. 10). This high current discharge occurred due to the power supply capacitance, which in this case was 70 mF, and during this process the power supply capacitance was charged to 500 V and discharged across the cathode-keeper gap during breakdown, where the resistance of the gap dropped from an >1MΩ resistance to under 1 ohm. This capacitance discharge released up to 8.75 J of energy within a mere 110 μs, which is equivalent of a mean power of 79.5 kW over that period. This significant power use can result in cathodic spots and vaporization of the electrodes.

A semi-empirical electrical model was also created to aid the electrical design efforts, and this model provided a simulated current peak (shown by the line marked "Simulation" in FIG. 10). Good agreement between the model result and the measured current surge can be seen in FIG. 10. This model allowed for rough sizing and sensitivity analysis of the current control measures developed in accordance with the present invention, as illustrated further below in Example 3.

Example 3

To mitigate the current surge problem of Comparative Example 2, in accordance with another aspect of the present invention, in this Example the hollow cathode apparatus was additionally provided with electrical circuitry to constitute a modified "soft start" electrical ignition system which enables a controlled rise of current through ignition, suppressing electrical inrush surges while also stabilising the diffusive secondary electron emission sustained discharge. In particular, a heaterless hollow cathode apparatus having the structure of the heaterless hollow cathode apparatus shown in FIGS. 1A and 1B, including the electrical circuitry (50), was provided. The impact of the electrical discharge surge during breakdown with such current control was analysed for the heaterless hollow cathode apparatus.

Figure 11:
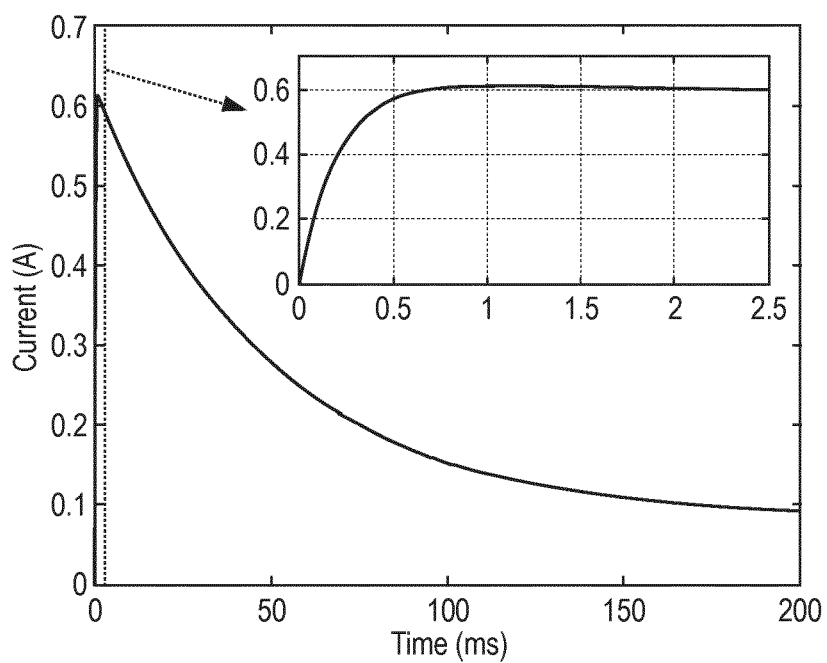
FIG. 11 is a graph showing the relationship between current and time during discharge for a heaterless hollow cathode apparatus in accordance with an embodiment of the present invention.

Utilising the sensitivity analysis as described above for Comparative Example 2, an empirical test campaign found that discharge stability throughout ignition was greatly improved with an 800 ohm thermistor and a 150 mH inductor in the electrical circuitry (50) of the apparatus of FIGS. 1A and 1B. The influence of the final electrical control setup utilised is shown in FIG. 11, which shows that the current surge during ignition was significantly smaller, down to ~600 mA from the original 650 A, and reached the peak in over 1 ms compared to the mere 40 μs. Furthermore, the model utilised the empirical resistance data of an uncontrolled breakdown surge. As such, the model provided a conservative estimate of the discharge surge with the implemented current controls, as the surge plasma resistance increases with decreasing current due to the negative differential resistance. This resistance characteristic is the reason the surge propagates and discharges the power supply capacitance.

This electrical system in accordance with the second aspect of the present invention, comprising a current control device arranged to function as an anti-surge current stabiliser during the ignition power mode, which preferably comprises a thermistor, and/or an inductor and optionally a diode as described above with reference to FIG. 1A, is designed to provide the required control of the current through ignition in a passive and low power usage manner. The system stabilises and maintains a uniform plasma discharge without current surges, while also working in parallel with the insulating casing to minimise thermal shock and erosion of the emitter during ignition. The design only utilises off-the-shelf components with two standard laboratory power supplies, thus allowing cost-effective incorporation of the heaterless hollow cathode apparatus into a given thruster or test system.

The invention claimed is:
1. A hollow cathode apparatus, the apparatus comprising:
a cathode tube composed of an electrically conductive material which is a refractory metal or a refractory metal alloy, the cathode tube having an input end for receiving an input gas, an output end, opposite to the input end, for outputting a plasma formed from the input gas, the cathode tube defining a central hollow cavity for forming the plasma, and an end wall at the output end of the cathode tube, the end wall closing the hollow cavity;
a supply conduit for inputting the input gas into the hollow cavity, the supply conduit having an outlet opening located in the end wall;
a tubular emitter positioned internally within the cathode tube and circumferentially surrounding an end portion of the central hollow cavity which is adjacent to the output end, wherein an outer tubular surface of the tubular emitter is electrically connected to an inner tubular surface of the cathode tube, and the tubular emitter is composed of a material for emitting electrons into the input gas to form a plasma in the end portion of the central hollow cavity when an electrical potential, above a particular potential threshold, is applied to the material of the tubular emitter,
an outer tubular dielectric barrier circumferentially surrounding an outer tubular surface of the cathode tube, the outer tubular dielectric barrier being composed of a barrier material which is electrically non-conductive, wherein the outer tubular dielectric barrier includes a flanged end region which surrounds an end surface of the cathode tube at the output end; and
an inner tubular dielectric barrier circumferentially surrounding a surface portion of the inner tubular surface of the cathode tube, which surface portion is adjacent to the tubular emitter, and the inner tubular dielectric barrier is composed of a barrier material which is electrically non-conductive;
wherein the hollow cathode apparatus is heaterless and is adapted so that the passage of electrical current through the emitter is sufficient to emit electrons from the emitter to form a plasma from the input gas.

2. The hollow cathode apparatus according to claim 1 wherein (i) the barrier material which is electrically non-conductive is composed of, or comprises, a dielectric material selected from a ceramic material or a glass material, preferably wherein the ceramic material or glass material is selected from alumina, zirconia, silicon nitride, boron nitride, a glass ceramic, or macor, or any combination thereof.

3. The hollow cathode apparatus according to claim 1 wherein the tubular dielectric barrier has a thickness of from 0.5 to 5 mm or from 0.5 to 2 mm.

4. The hollow cathode apparatus according to claim 1 further comprising a tubular cathode electrode circumferentially surrounding the cathode tube, wherein the tubular cathode electrode has a tubular body circumferentially surrounding the outer tubular surface of the cathode tube and the outer tubular dielectric barrier, and a flange covering the output end of the cathode tube and defining an output orifice within the flange, the output orifice being aligned with the end portion of the central hollow cavity.

5. The hollow cathode apparatus according to claim 4 wherein the tubular cathode electrode and the cathode tube are separated by an electrical insulation material provided therebetween at, or in the vicinity of, the input end of the cathode tube.

6. The hollow cathode apparatus according to claim 4 wherein the hollow cathode apparatus further comprises a tubular keeper electrode circumferentially surrounding the tubular cathode electrode, wherein the tubular keeper electrode has a tubular body circumferentially surrounding an outer tubular surface of the tubular cathode electrode, and a keeper flange covering the flange of the tubular cathode electrode, the keeper flange defining a keeper output orifice within the keeper flange, the keeper output orifice being aligned with, and having a larger width, or for a circular orifice a larger diameter, than, the output orifice of the tubular cathode electrode.

7. The hollow cathode apparatus according to claim 6 wherein the tubular keeper electrode and the tubular cathode electrode are separated by an electrical insulation material provided therebetween at, or in the vicinity of, the input end of the cathode tube.

8. The hollow cathode apparatus according to claim 1 further comprising an end cover covering an end surface of the emitter.

9. The hollow cathode apparatus according to claim 8 wherein the end cover is composed of, or comprises, an electrically conductive metal, or a dielectric material selected from a ceramic material or a glass material, preferably wherein the electrically conductive metal is selected from tungsten, molybdenum, graphite, rhenium or the ceramic or glass material is selected from alumina, zirconia, silicon nitride, boron nitride, a glass ceramic, or macor, or any combination thereof.

10. The hollow cathode apparatus according to claim 1 further comprising a sleeve layer sandwiched between the cathode tube and the emitter, the sleeve layer being composed of an electrically conductive material and electrically connecting the emitter to the cathode tube, preferably wherein the sleeve layer is composed of, or comprises, graphite or rhenium.

11. The hollow cathode apparatus according to claim 1 further comprising a radiation shielding layer adjacent to the outer tubular dielectric barrier, the radiation shielding layer circumferentially surrounding the cathode tube.

12. The hollow cathode apparatus according to claim 11 wherein the radiation shielding layer is sandwiched between the outer tubular dielectric barrier and the cathode tube and/or wherein the radiation shielding layer is composed of, or comprises, a metal foil, preferably wherein the metal foil is selected from molybdenum, tantalum or rhenium.

13. The hollow cathode apparatus according to claim 1 wherein the refractory metal or refractory metal alloy is selected from molybdenum, tantalum, or rhenium, or any combination thereof and/or wherein the emitter is composed of, or comprises, lanthanum hexaboride, calcium aluminate electride, or a porous metal matrix.

14. The hollow cathode apparatus according to claim 13 wherein the porous metal matrix comprises a tungsten matrix, impregnated with at least one of, or a mixture of one or more of, ceramic inorganic oxides, preferably wherein the ceramic inorganic oxides are selected from barium oxide, calcium oxide, scandate and alumina.

15. The hollow cathode apparatus according to claim 1 wherein the cathode tube further comprises an outwardly directed flange at the outer end of the cathode tube, the outwardly directed flange being fitted to the end wall.

16. A system comprising:
the hollow cathode apparatus according to claim 1,
an anode which is spaced from the output end of the tubular cathode, and
electrical circuitry connected between the hollow cathode apparatus and the anode for connection to a source of electrical power for providing an electrical potential between the cathode and anode to cause an electric current to pass from the emitter into the input gas to form a plasma which is then output through the output end of the cathode tube to form a plasma plume.

* * * * *